United States Patent
Jang et al.

(10) Patent No.: US 11,094,636 B2
(45) Date of Patent: Aug. 17, 2021

(54) SEMICONDUCTOR PACKAGE AND METHOD OF MANUFACTURING THE SEMICONDUCTOR PACKAGE

(71) Applicant: Samsung Electronics Co., Ltd., Suwon-si (KR)

(72) Inventors: Jaegwon Jang, Hwasung-si (KR); Inwon O, Hwasung-si (KR); Jongyoun Kim, Seoul (KR); Seokhyun Lee, Hwaseong-si (KR); Yeonho Jang, Hwasung-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/671,625

(22) Filed: Nov. 1, 2019

(65) Prior Publication Data
US 2020/0373243 A1    Nov. 26, 2020

(30) Foreign Application Priority Data
May 21, 2019    (KR) .................. 10-2019-0059733

(51) Int. Cl.
| H01L 23/00 | (2006.01) |
| H01L 21/56 | (2006.01) |
| H01L 23/31 | (2006.01) |
| H01L 23/528 | (2006.01) |
| H01L 23/522 | (2006.01) |
| H01L 23/66 | (2006.01) |
| H01L 23/538 | (2006.01) |
| H01L 23/498 | (2006.01) |
| H01L 25/065 | (2006.01) |

(52) U.S. Cl.
CPC ...... *H01L 23/5386* (2013.01); *H01L 23/3121* (2013.01); *H01L 23/49816* (2013.01); *H01L 23/49827* (2013.01); *H01L 24/13* (2013.01); *H01L 24/45* (2013.01); *H01L 24/73* (2013.01); *H01L 25/0655* (2013.01)

(58) Field of Classification Search
CPC ... H01L 23/544; H01L 24/19; H01L 23/5389; H01L 23/49827
See application file for complete search history.

(56) References Cited

U.S. PATENT DOCUMENTS

| 7,812,456 B2 | 10/2010 | Koide et al. |
| 8,274,157 B2 | 9/2012 | Koide et al. |
| 8,288,201 B2 | 10/2012 | Pagaila et al. |

(Continued)

FOREIGN PATENT DOCUMENTS

JP         5007250 B2      8/2012

*Primary Examiner* — Brian Turner
(74) *Attorney, Agent, or Firm* — Harness, Dickey & Pierce, P.L.C.

(57) ABSTRACT

A semiconductor package includes a mold substrate, at least one semiconductor chip disposed in the mold substrate and including chip pads, and a redistribution wiring layer covering a first surface of the mold substrate and including a first redistribution wiring and a second redistribution wiring stacked in at least two levels to be electrically connected to the chip pads. The first redistribution wiring includes a signal line extending in a first region, and the second redistribution wiring includes a ground line in a second region overlapping with the first region. The ground line has a plurality of through holes of polygonal column shapes.

16 Claims, 29 Drawing Sheets

(56) References Cited

U.S. PATENT DOCUMENTS

| | | |
|---|---|---|
| 8,558,391 B2 | 10/2013 | Koide et al. |
| 9,826,630 B2 | 11/2017 | Vincent |
| 9,941,248 B2 | 4/2018 | Yang et al. |
| 10,103,106 B2 | 10/2018 | Dang et al. |
| 10,109,588 B2 | 10/2018 | Jeong et al. |
| 10,115,648 B2 | 10/2018 | Seo et al. |
| 2006/0144616 A1 | 7/2006 | Lin et al. |
| 2013/0008705 A1* | 1/2013 | Tseng .................. H01L 21/4857 174/266 |
| 2014/0097885 A1* | 4/2014 | Hu ......................... H03K 17/98 327/517 |
| 2015/0270233 A1* | 9/2015 | Vincent .................. H01L 24/02 257/773 |
| 2016/0128191 A1* | 5/2016 | Fukuchi ................. H05K 1/116 174/258 |
| 2016/0293575 A1* | 10/2016 | Liu .................... H01L 23/49827 |
| 2017/0162527 A1* | 6/2017 | Kim ...................... H01L 23/16 |
| 2018/0076166 A1* | 3/2018 | Yu ....................... H01L 21/4853 |

* cited by examiner

SEMICONDUCTOR PACKAGE AND METHOD OF MANUFACTURING THE SEMICONDUCTOR PACKAGE

PRIORITY STATEMENT

This application claims priority under 35 U.S.C. § 119 to Korean Patent Application No. 10-2019-0059733, filed on May 21, 2019 in the Korean Intellectual Property Office (KIPO), the contents of which are herein incorporated by reference in their entirety.

BACKGROUND

1. Field

Example embodiments relate to a semiconductor package and/or a method of manufacturing the semiconductor package. For example, at least some example embodiments relate to a fan out wafer level package (FOWLP) and/or a method of manufacturing the FOWLP.

2. Description of the Related Art

A thickness of a semiconductor packages may be reduced by utilizing fan out type wafer level packages. A redistribution wiring layer of the wafer level package may have a configuration where a signal line is separated from an underlying ground plane or is sandwiched between two ground planes in order to improve transmission properties of the signal line and/or reduce impedance. However, delamination from the layers may be caused by thermal coefficient difference between a metal material of the ground plane and a dielectric material.

SUMMARY

Example embodiments provide a semiconductor package capable of reducing warpage thereof and having excellent reliability.

Example embodiments provide a method of manufacturing the semiconductor package.

According to example embodiments, a semiconductor package may include a mold substrate; at least one semiconductor chip in the mold substrate, the at least one semiconductor chip including chip pads; and a redistribution wiring layer covering a first surface of the mold substrate, redistribution wiring layer including a first redistribution wiring and a second redistribution wiring stacked in at least two levels, the first redistribution wiring and the second redistribution wiring configured to electrically connect to the chip pads, the first redistribution wiring including a signal line extending in a first region, and the second redistribution wiring including a ground line in a second region overlapping with the first region, the ground line having a plurality of through holes therein of a polygonal column shape.

According to example embodiments, a semiconductor package may include a redistribution wiring layer including a first redistribution wiring and a second redistribution wiring stacked in at least two levels, the first redistribution wiring including a signal line extending in a first region, and the second redistribution wiring including a ground line in a second region overlapping with the first region, the ground line having a plurality of through holes therein of a polygonal column shape; at least one semiconductor chip on the redistribution wiring layer, the at least one semiconductor chip including chip pads electrically connected to the first redistribution wiring and the second redistribution wiring; and a mold substrate on the redistribution wiring layer such that the mold substrate covers the semiconductor chip.

According to example embodiments, a method of manufacturing a semiconductor package may include stacking at least one semiconductor chip on a dummy substrate; forming a mold substrate on the dummy substrate such that the mold substrate covers the semiconductor chip; removing the dummy substrate from the mold substrate such that the semiconductor chip is exposed from a first surface of the mold substrate; and forming, on the first surface of the mold substrate, a redistribution wiring layer including a first redistribution wiring and a second redistribution wiring stacked in at least two levels, the first redistribution wiring and the second redistribution wiring configured to electrically connect to chip pads of the semiconductor chip, the first redistribution wiring including a signal line extending in a first region, and the second redistribution wiring including a ground line in a second region overlapping with the first region, the ground line having a plurality of through holes therein of a polygonal column shape.

According to example embodiments, a method of manufacturing a semiconductor package may include stacking a redistribution wiring layer on a dummy substrate, the redistribution wiring layer including a first redistribution wiring and a second redistribution wiring stacked in at least two levels, the first redistribution wiring including a signal line extending in a first region, and the second redistribution wiring including a ground line in a second region overlapping with the first region, the ground line having a plurality of through holes of a polygonal column shape therein; stacking at least one semiconductor chip on the redistribution wiring layer; forming a mold substrate on the redistribution wiring layer such that the mold substrate covers the semiconductor chip; and removing the dummy substrate from the mold substrate.

According to example embodiments, a semiconductor package may include a fan out type redistribution wiring layer. The redistribution wiring layer may include a first redistribution wiring and a second redistribution wiring stacked in at least two levels to be electrically connected to chips pads of a semiconductor chip. The first redistribution wiring may include a signal line extending in a first region, and the second redistribution wiring may include a ground line extending in a second region overlapping with the first region. The ground line may include a plurality of the through holes having a polygonal column shape, for example, hexagonal column shapes.

The second redistribution wiring may include a ground (or, alternatively, a power) line having through holes of hexagonal column shapes. When the ground (or, alternatively, the power) line is formed as a wiring structure including isolated patterns of a honeycomb structure, each wiring in each level of the redistribution wiring layer may be formed to have a relatively small metal ratio.

Thus, an adhesive force between a metal of the redistribution wiring layer and a dielectric material may be increased due to an anchoring effect of the honeycomb pattern, to thereby inhibit (or, alternatively, prevent) peeling off of the layers due to thermal coefficient difference between the metal and the dielectric material. Further, gas trapping effects occurring when the insulation layer of the redistribution wiring layer is formed by a spin coating process may be inhibited (or, alternatively, prevented) to thereby improve reliability of a fan out wafer level package having a relatively thin thickness.

BRIEF DESCRIPTION OF THE DRAWINGS

Example embodiments will be more clearly understood from the following detailed description taken in conjunction with the accompanying drawings. FIGS. 1 to 30C represent non-limiting, example embodiments as described herein.

FIG. 1 is a cross-sectional view illustrating a semiconductor package in accordance with example embodiments.

FIG. 2 is a plan view illustrating the semiconductor package in FIG. 1.

FIG. 3 is a cross-sectional view taken along the line II-II' in FIG. 2.

FIGS. 4 and 5 are plan views illustrating a first redistribution wiring layer and a second redistribution wiring layer in regions overlapping with portion A in FIG. 2.

FIGS. 6 to 21 are views illustrating a method of manufacturing a semiconductor package according to example embodiments.

FIG. 22 is a cross-sectional view illustrating a semiconductor package in accordance with example embodiments.

FIGS. 23 and 24 are plan views illustrating a second redistribution wiring layer and a third redistribution wiring layer in regions overlapping with each other.

FIGS. 25 to 29 are views illustrating a method of manufacturing a semiconductor package in accordance with example embodiments.

FIGS. 30A to 30C are plan views illustrating portions of a ground (or, alternatively, a power) line of a redistribution wiring layer in accordance with example embodiments.

DETAILED DESCRIPTION

Hereinafter, example embodiments will be explained in detail with reference to the accompanying drawings.

Figure 1:
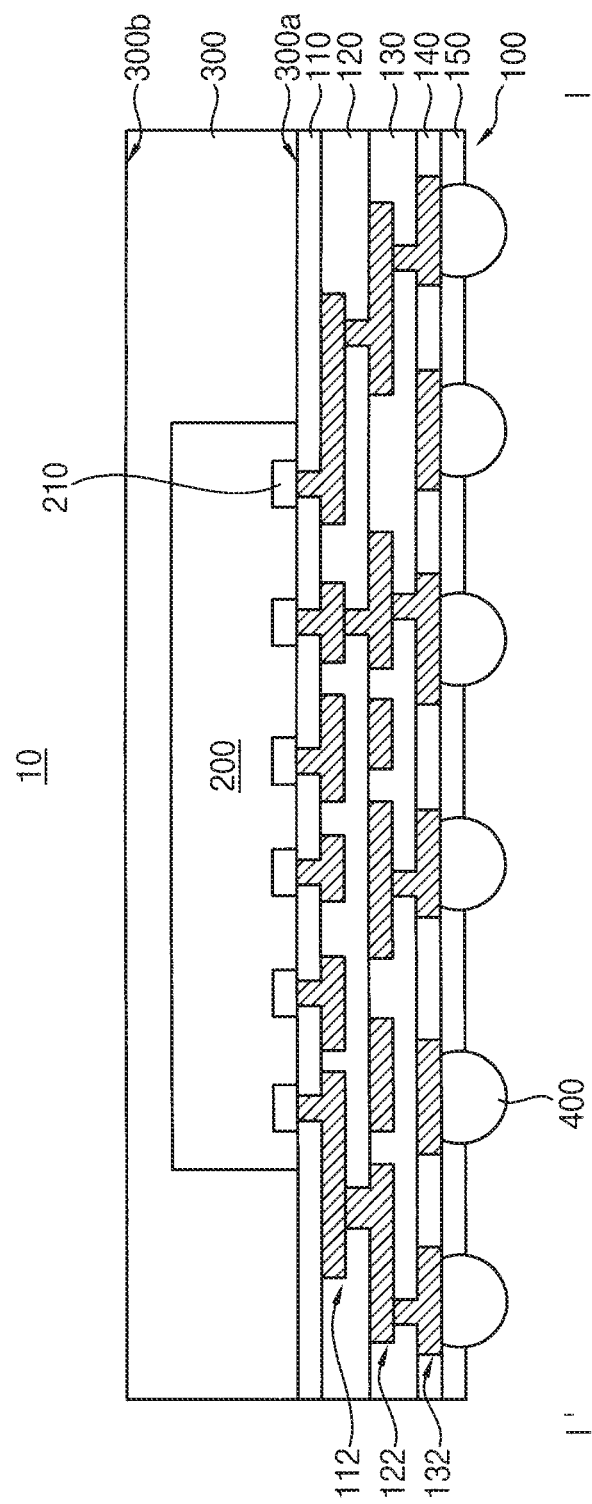
Figure 2:
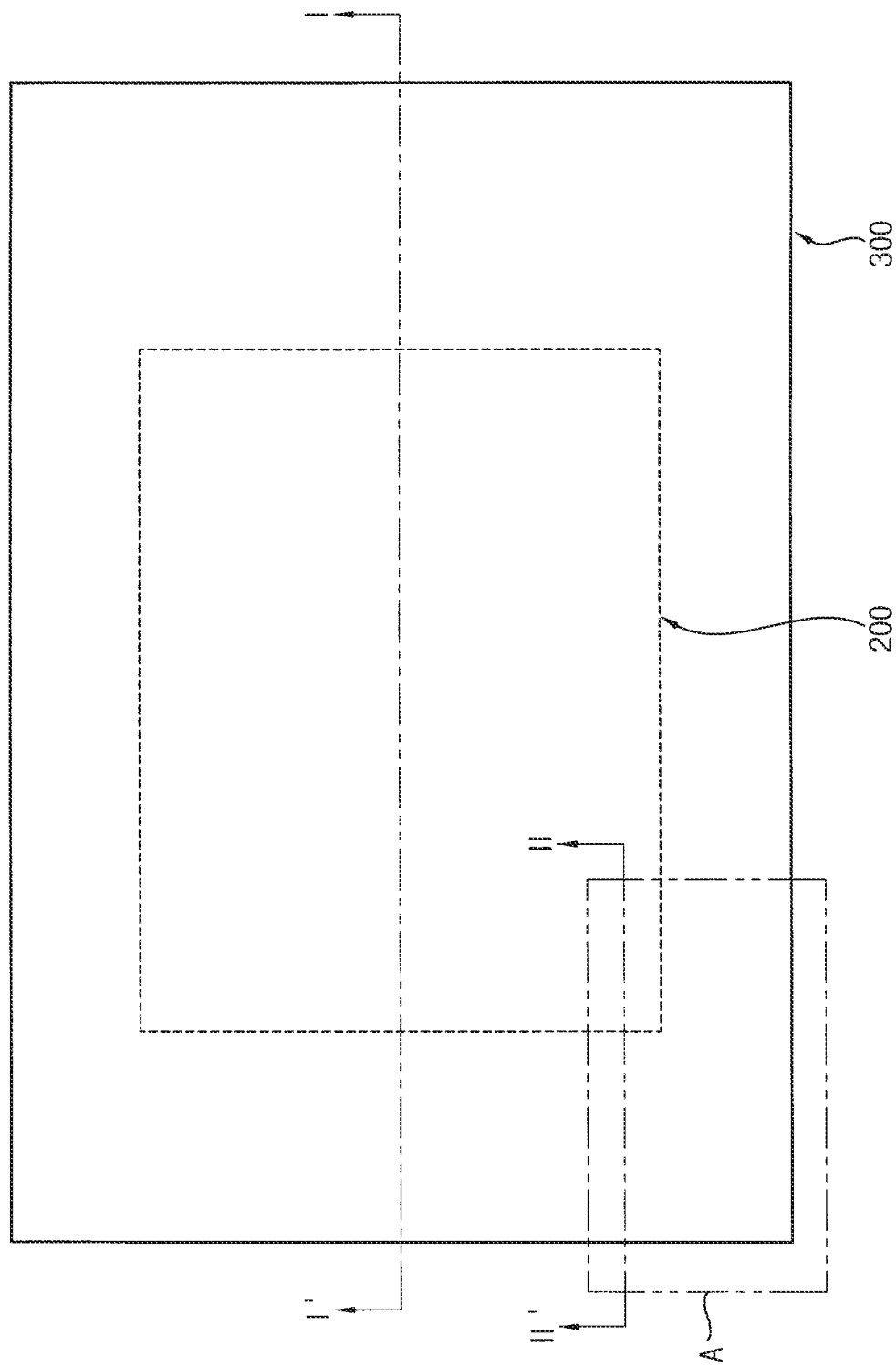
Figure 3:
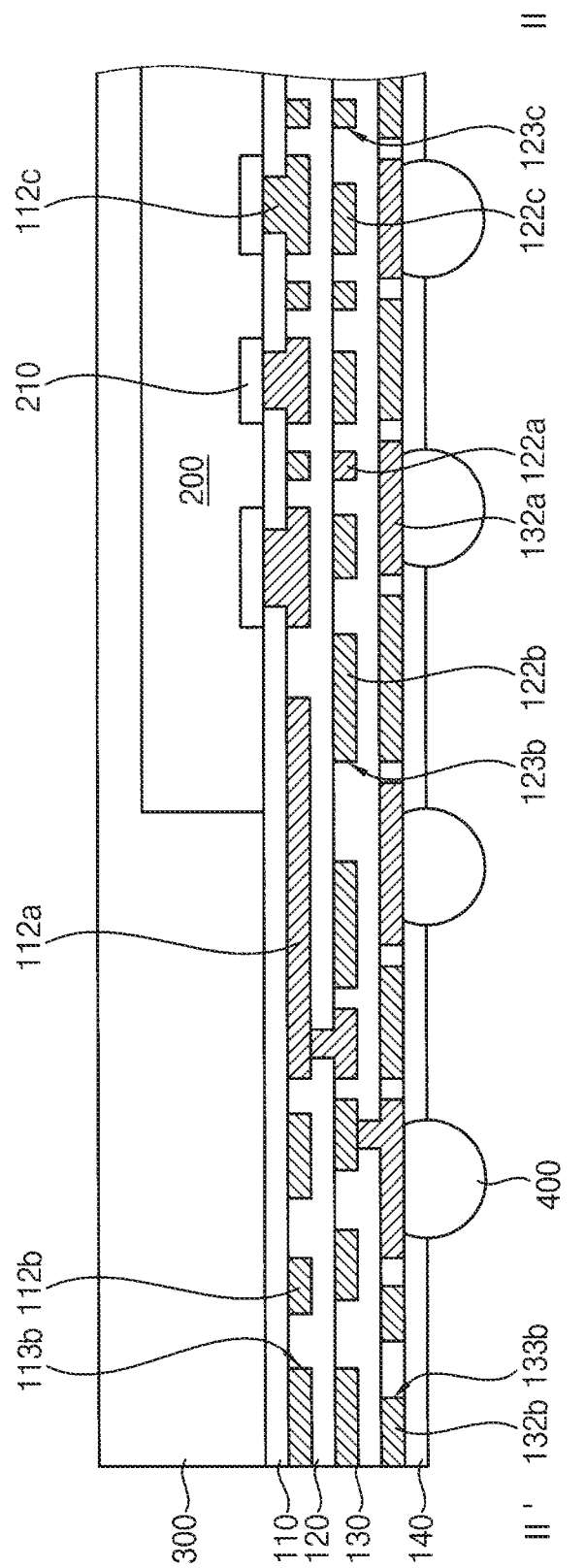
Figure 4:
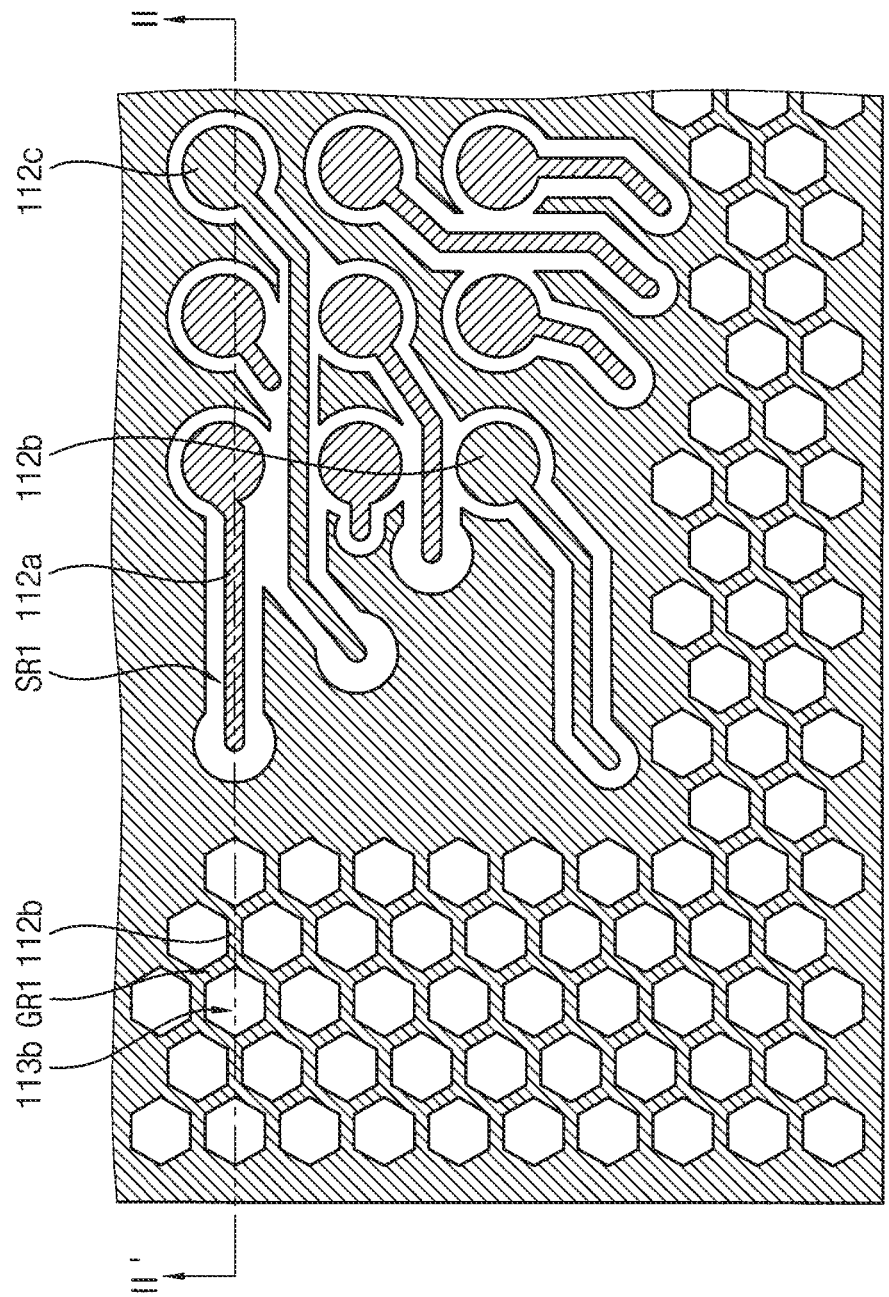
Figure 5:
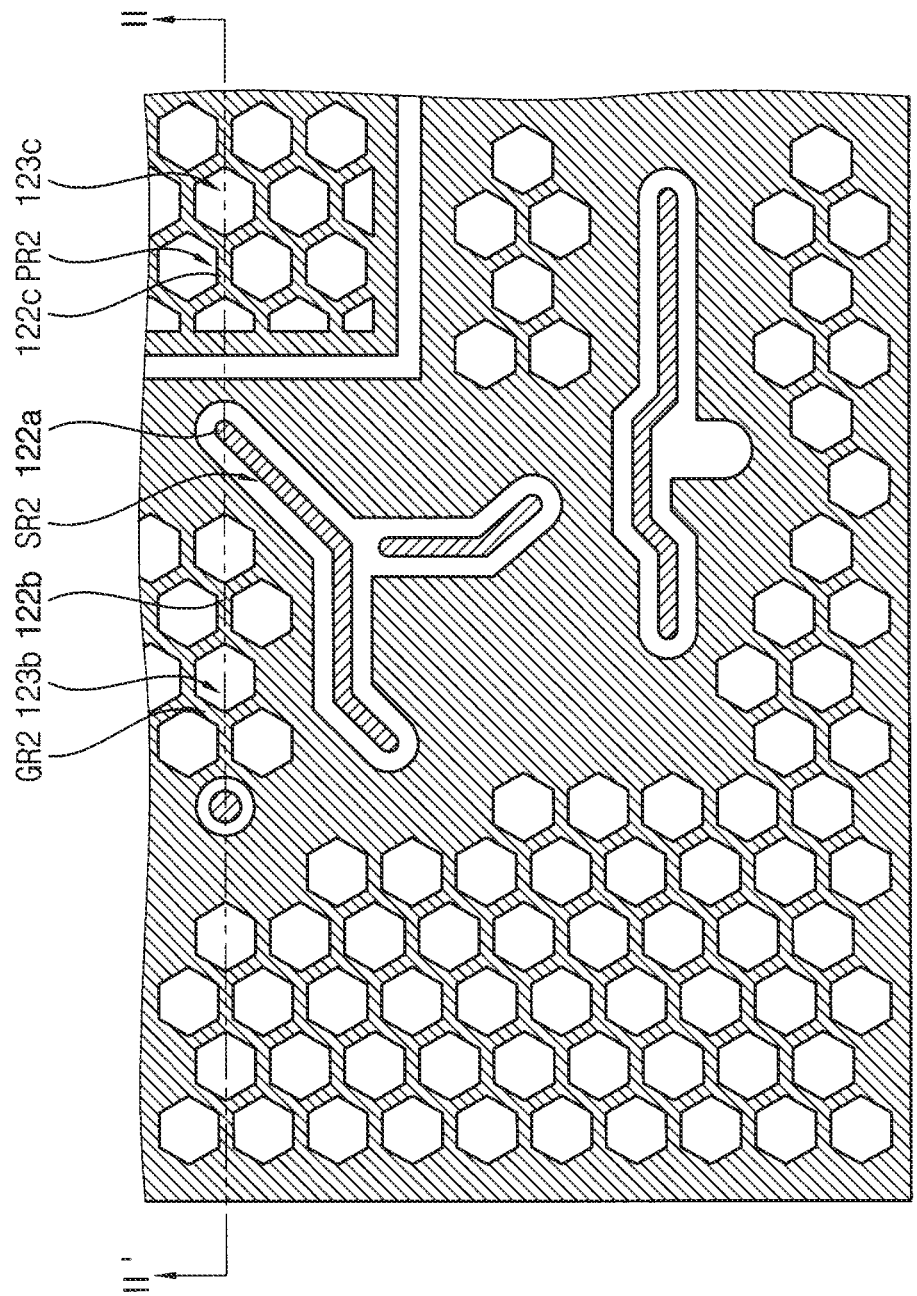

FIG. 1 is a cross-sectional view illustrating a semiconductor package in accordance with example embodiments. FIG. 2 is a plan view illustrating the semiconductor package in FIG. 1. FIG. 3 is a cross-sectional view taken along the line II-II' in FIG. 2. FIGS. 4 and 5 are plan views illustrating a first redistribution wiring layer and a second redistribution wiring layer in regions overlapping with portion A in FIG. 2. FIG. 1 is a cross-sectional view taken along the line I-I' in FIG. 1. FIG. 3 includes cross-sectional portions taken along the line II-II' in FIGS. 4 and 5.

Referring to FIGS. 1 to 5, a semiconductor package 10 may include a mold substrate 300, a semiconductor chip 200 disposed in the mold substrate 300, and a redistribution wiring layer 100 covering a first surface 300a of the mold substrate 300 and including at least two redistribution wirings stacked on each other to electrically be connected to chip pads 210 of the semiconductor chip 200. The semiconductor package 10 may further include outer connection members 400 disposed on the redistribution wiring layer 100.

In example embodiments, the semiconductor package 10 may be a fan out wafer level package including the mold substrate 300 and the redistribution wiring layer 100 formed on the first surface 300a of the mold substrate 300. The redistribution wiring layer 100 may be formed on the first surface 300a of the mold substrate 300 by a redistribution wiring process in wafer level. At least one semiconductor chip 200 may be received in the mold substrate 300.

In particular, the semiconductor chip 200 may include a plurality of the chip pads 210 on the first surface (e.g., active surface) thereof. The semiconductor chip 200 may be received in the mold substrate 300 such that the first surface thereof on which the chip pads 210 are formed faces toward the redistribution wiring layer 100. The first surface of the semiconductor chip 200 may be exposed from the first surface 300a of the mold substrate 300. Accordingly, the chip pads 210 of the semiconductor chip 200 may be exposed from the first surface 300a of the mold substrate 300.

The chip pads 210 may include input/output terminals such as signal chip pads serving as a data pin, power chip pads serving as a power pin, ground chip pads serving as a ground pin, Although only some chip pads are illustrated in the figures, structures and arrangements of the chip pads are examples, and it may not limited thereto. Further, although only one semiconductor chip is illustrated, it may be understood that the number of the stacked semiconductor chips may not limited thereto.

The semiconductor chip 200 may include integrated circuits. For example, the semiconductor chip 200 may be a logic chip including logic circuits. The logic chip may be a controller to control a memory chip. The semiconductor chip 200 may be a memory chip including memory circuits, such as a dynamic random access memory (DRAM), a static random access memory (SRAM), a flash memory, a phase change memory (PRAM), a resistive random access memory (ReRAM), a ferroelectric random access memory (FRAM), or a magnetic random access memory (MRAM).

A portion of the redistribution wirings of the redistribution wiring layer 100 may make contact with the chip pads 210 exposed from the first surface 300a of the mold substrate 300.

In particular, the redistribution wiring layer 100 may include a first redistribution wiring layer as an uppermost wiring layer. The first redistribution wiring layer of the redistribution wiring layer 100 may include a first insulation layer 110 formed on the first surface 300a of the mold substrate 300 and having first openings exposing the chip pads 210, and first redistribution wirings 112 formed on the first insulation layer 110. At least portions of the first redistribution wirings 112 may directly contact the chip pads 210 through the first openings.

For example, the first insulation layer may include polymer, a dielectric material, etc. The first redistribution wiring may include aluminum (Al), copper (Cu), tin (Sn), nickel (Ni), gold (Au), platinum (Pt), or an alloy thereof.

As illustrated in FIGS. 3 and 4, the first redistribution wiring 112 may include a first signal line 112a and a first ground line 112b. Additionally, the first redistribution wiring 112 may further include a first power line 112c. At least a portion of the first signal line 112a may make contact with the signal chip pad of the semiconductor chip 200 through the first opening. The first ground line 112b may make contact with the ground chip pad through the first opening. The first power line 112c may make contact with the power chip pad through the first opening.

As viewed in plan view, the first signal line 112a may extend in a first signal region SR1. The first ground line 112b may extend in a first ground region GR1 which is spaced apart from the first signal region SR1. The first ground line 112b may include a metal pattern having a plurality of through holes which have a polygonal column shape. For example, the first ground line 112b may have through holes 113b of hexagonal column shapes. The through holes 113b may be arranged in an array to have a honeycomb structure.

The redistribution wiring layer 100 may include a second redistribution wiring layer stacked on the first redistribution wiring layer. The second redistribution wiring layer of the redistribution wiring layer 100 may include a second insulation layer 120 formed on the first insulation layer 110 and having second openings exposing the first redistribution wirings 112, and second redistribution wirings 122 formed on the second insulation layer 120. At least portions of the second redistribution wirings 122 may directly contact the first redistribution wirings 112 through the second openings.

As illustrated in FIGS. 3 and 5, the second redistribution wiring 122 may include a second signal line 122*a* and a second ground line 122*b*. Additionally, the second redistribution wiring 122 may further include a second power line 122*c*. At least a portion of the second signal line 122*a* may make contact with the first signal line through the second opening. The second ground line 122*b* may make contact with the first ground line through the second opening. The second power line 122*c* may make contact with the first power line through the second opening.

As viewed in plan view, the second signal line 122*a* may extend in a second signal region SR2. The second ground line 122*b* may extend in a second ground region GR2 which is spaced apart from the second signal region SR2. The second ground line 122*b* may include a metal pattern having a plurality of through holes which each have a polygonal column shape. For example, the second ground line 122*b* may have through holes 123*b* of hexagonal column shapes. The through holes 123*b* may be arranged in an array to have a honeycomb structure. Further, the second power line 122*c* may extend in a second power region PR2 which is spaced apart from the second signal region SR2, and may include a metal pattern having a plurality of through holes which have polygonal column shapes respectively. For example, the second power line 122*c* may have through holes 123*c* of hexagonal column shapes. The through holes 123*c* may be arranged in an array to have a honeycomb structure.

In example embodiments, the second ground region GR2 may be overlapped with the first signal region SR1. The second signal region SR2 may be overlapped with the first ground region GR1. Accordingly, the first redistribution wiring layer having the first signal line 112*a* may serve as a microstrip line where a signal line is over a ground plane, and the second redistribution wiring layer having the second signal line 122*a* may serve as a strip line where a signal line is interposed between two ground planes.

The redistribution layer 100 may include a third redistribution layer stacked on the second redistribution layer. The third redistribution layer may be a lowermost wiring layer. The third redistribution wiring layer of the redistribution wiring layer 100 may include a third insulation layer 130 formed on the second insulation layer 120 and having third openings exposing the second redistribution wirings 122, and third redistribution wirings 132 formed on the second insulation layer 120. At least portions of the third redistribution wirings 132 may directly contact the second redistribution wirings 122 through the third openings.

The redistribution wiring layer 100 may include a fourth insulation layer 140 formed on the third insulation layer 130 and having fourth openings exposing the third redistribution wirings 132. The redistribution wiring layer 100 is an example, it may be understood that the number, sizes, arrangements, etc. of the stacked redistribution wirings and insulation layers of the redistribution wiring layer may not be limited thereto.

Thus, the redistribution wiring layer 100 may include fan out type solder ball landing pads which are formed on the mold substrate 300 corresponding to each die of a wafer by performing semiconductor manufacturing processes.

Outer connection members 400 may be disposed on portions of the third redistribution wirings 132 exposed through the fourth openings. For example, the outer connection member 400 may include a solder ball. In this case, the portion of the third redistribution wiring 132 may serve as a landing pad, that is, a package pad.

As mentioned above, the semiconductor package 10 as the fan out wafer level package may include the fan out type redistribution wiring layer 100 formed on the first surface 300*a* of the mold substrate 300 by a redistribution wiring process. The redistribution wiring layer 100 may include the first redistribution wiring 112 and the second redistribution wiring 122 stacked in at least two levels to be electrically connected to the chips pads. The first redistribution wiring 112 may include the signal line 112*a* extending in the first signal region SR1, and the second redistribution wiring 122 may include the ground line 122*b* extending in the second ground region GR2 overlapping with the first region SR1. The ground line 122*b* may include the plurality of the through holes 123*b* having polygonal column shapes, for example, hexagonal column shapes.

The second redistribution wiring 122 may include the ground (or, alternatively, the power) line having the through holes of the hexagonal column shapes. When the ground (or, alternatively, the power) line is formed as a wiring structure including isolated patterns having a honeycomb structure, each wiring in each level of the redistribution wiring layer may have a relatively small metal ratio.

Thus, an adhesive force between the metal of the redistribution wiring layer 100 and a dielectric material may be increased due to an anchoring effect of the honeycomb pattern, to thereby inhibit (or, alternatively, prevent) peeling off of the layers due to thermal coefficient difference between the metal and the dielectric material. Further, gas trapping effects occurring when the insulation layer of the redistribution wiring layer 100 is formed by a spin coating process may be inhibited (or, alternatively, prevented) to thereby improve reliability of the fan out wafer level package having a relatively thin thickness.

Hereinafter, a method of manufacturing the semiconductor package in FIG. 1 will be explained.

FIGS. 6 to 21 are views illustrating a method of manufacturing a semiconductor package according to example embodiments. FIG. 9 is a plan view of FIG. 8. FIGS. 8, 10, 11, 14, 17, 20 and 21 are cross-sectional views taken along the line I-I' in FIG. 9. FIGS. 13, 16 and 19 are cross-sectional views taken along the line II-II' I FIG. 9. FIGS. 12, 15 and 18 are plan views illustrating a portion of a wiring layer in a region overlapping portion A in FIG. 9. FIG. 13 is a cross-sectional view taken along the line II-II' in FIG. 12. FIG. 16 is a cross-sectional view taken along the line II-II' in FIG. 15. FIG. 19 is a cross-sectional view taken along the line II-II' in FIG. 18.

Figure 6:
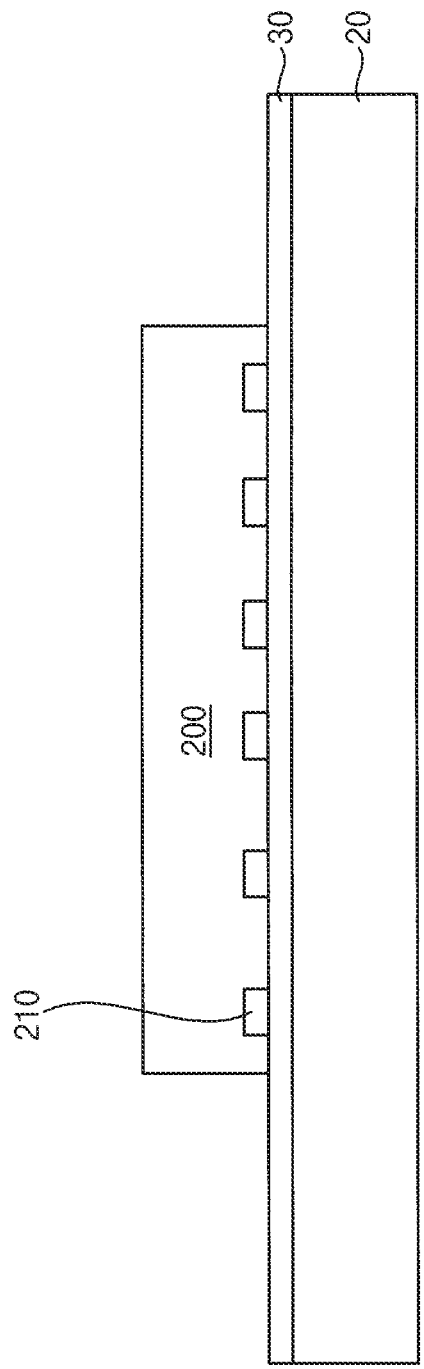

Referring to FIG. 6, first, a separation layer 30 may be formed on a dummy substrate 20, and then, a semiconductor chip 200 may be stacked on the separation layer 30.

In example embodiments, the dummy substrate 20 may be used as a base substrate on which at least one semiconductor chip is stacked and a mold substrate is to be formed to cover the semiconductor chip. The dummy substrate 20 may have a size corresponding to a wafer on which a semiconductor fabrication process is performed. The dummy substrate 20 may include, for example, a silicon substrate, a glass substrate, or a non-metal or metal plate.

The separation layer 30 may include a polymer tape acting as a temporary adhesive. The separation layer 30 may include a material that loses its adhesive strength when irradiated with light or heated. The separation layer 30 may include, for example, dual cure silicone adhesive that is cross-linkable by irradiation of ultraviolet ray or visible light.

In example embodiments, the semiconductor chip 200 may include a plurality of chip pads 210 on a first surface (e.g., active surface) thereof. The semiconductor chip 200 may be disposed on the dummy substrate 20 such that the first surface thereof on which the chip pads 210 are formed faces toward the dummy substrate 20.

The chip pads 210 may include input/output terminals such as signal chip pads serving as a data pin, power chip pads serving as a power pin, ground chip pads serving as a ground pin, Although only some chip pads are illustrated in the figures, structures and arrangements of the chip pads are examples, and it may not limited thereto. Further, although only one semiconductor chip is illustrated, it may be understood that the number of the stacked semiconductor chips may not limited thereto.

The semiconductor chip 200 may include integrated circuits. For example, the semiconductor chip 200 may be a logic chip including logic circuits. The logic chip may be a controller to control a memory chip. The semiconductor chip 200 may be a memory chip including memory circuits, such as a dynamic random access memory (DRAM), a static random access memory (SRAM), a flash memory, a phase change memory (PRAM), a resistive random access memory (ReRAM), a ferroelectric random access memory (FRAM), or a magnetic random access memory (MRAM).

Figure 7:
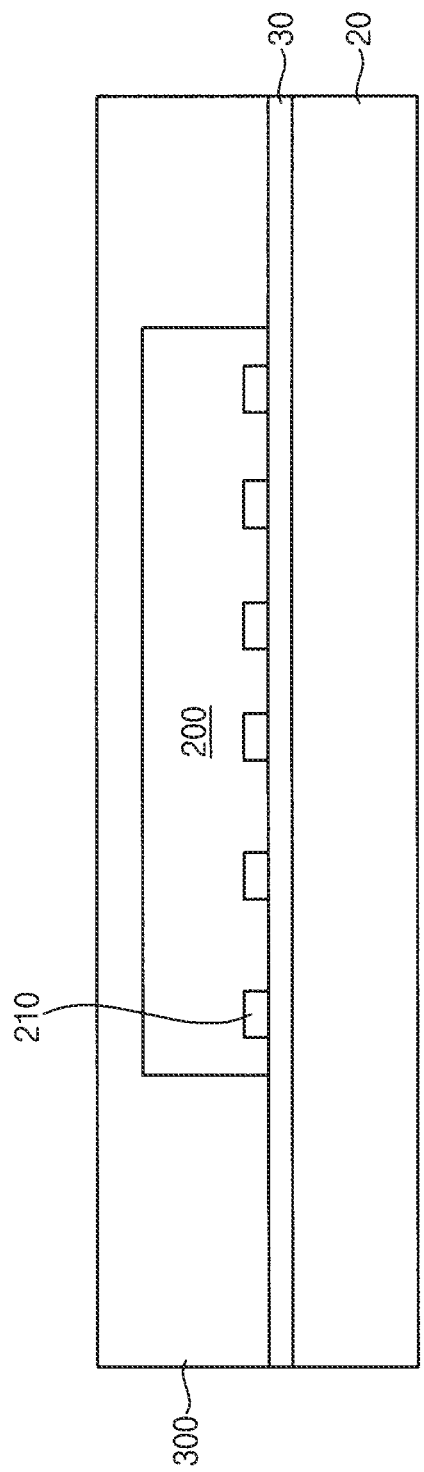

Referring to FIG. 7, a mold substrate 300 may be formed on the dummy substrate 20 to cover the semiconductor chip 200.

In example embodiments, the mold substrate 300 covering the semiconductor chip 200 may be formed by forming a molding material on the separation layer 30 by a molding process. The mold substrate 300 may include, for example, an epoxy molding compound.

Figure 8:
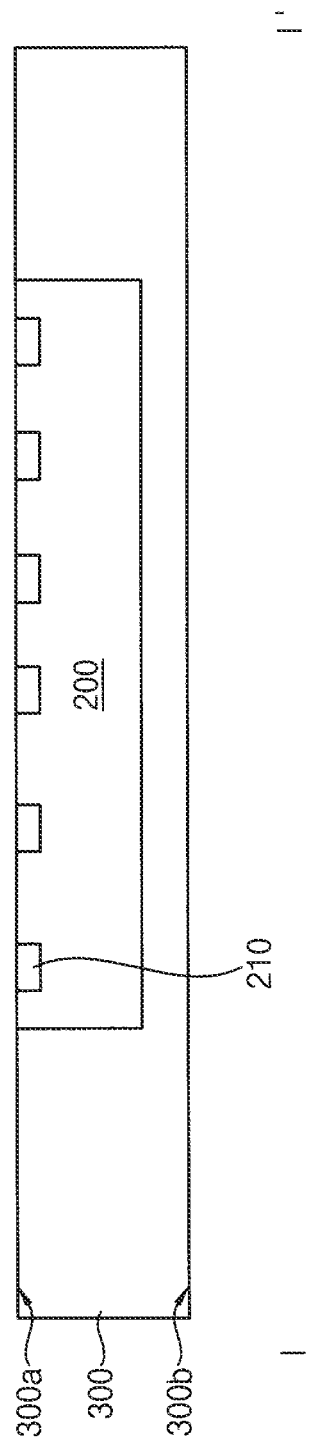
Figure 9:
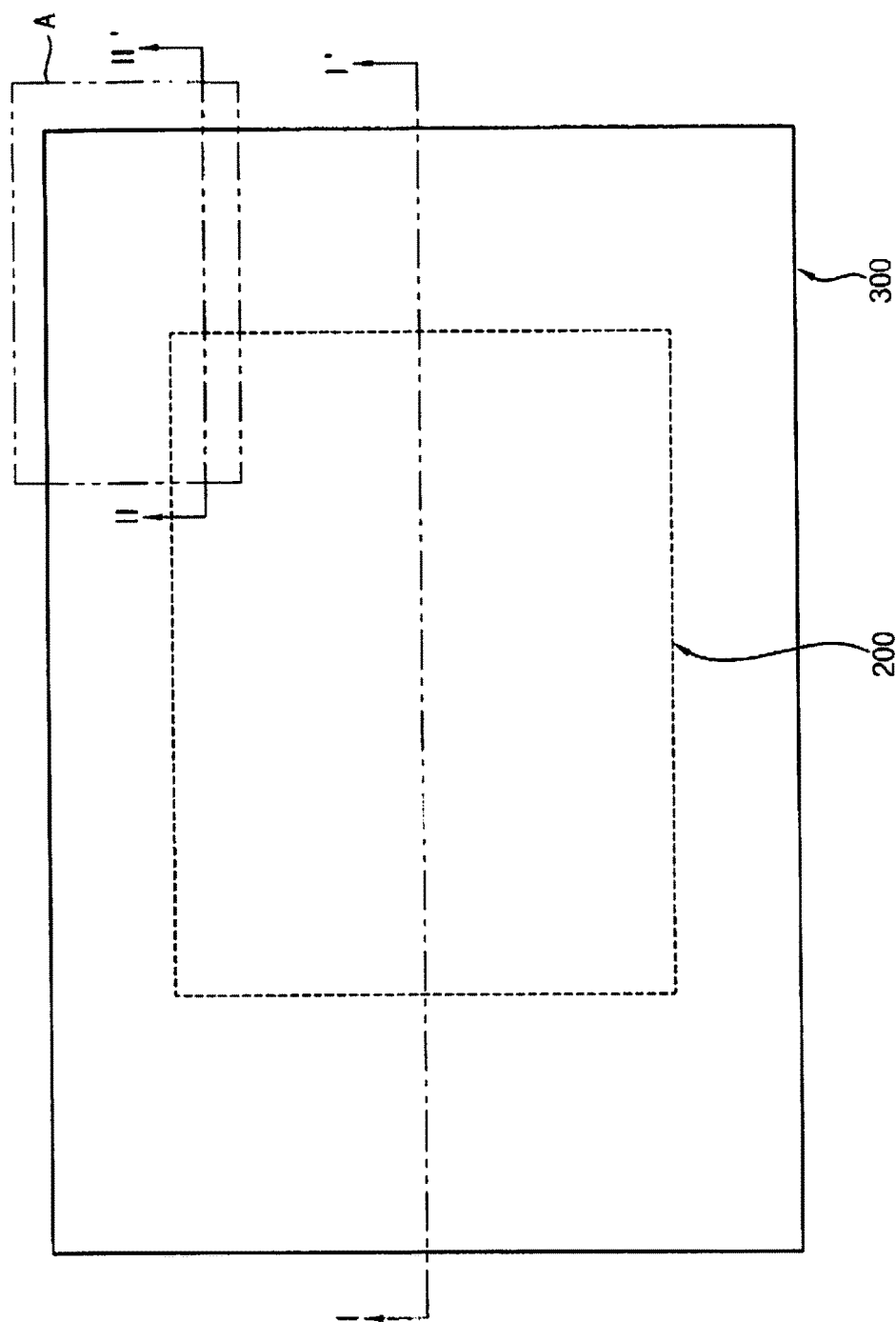

Referring to FIGS. 8 and 9, the structure including the mold substrate 300 formed therein in FIG. 7 may be reversed, and then, the dummy substrate 20 and the separation layer 30 may be removed from the mold substrate 300.

In example embodiments, the separation layer 30 may be irradiated with light or may be heated to remove the dummy substrate 20 from the substrate 300. As the dummy substrate 20 is removed, the first surface of the semiconductor chip 200 may be exposed from a first surface 300a of the mold substrate 300. Accordingly, although it is not illustrated in FIG. 9, the chip pads 210 of the semiconductor chip 200 may be exposed from the first surface 300a of the mold substrate 300.

Figure 10:
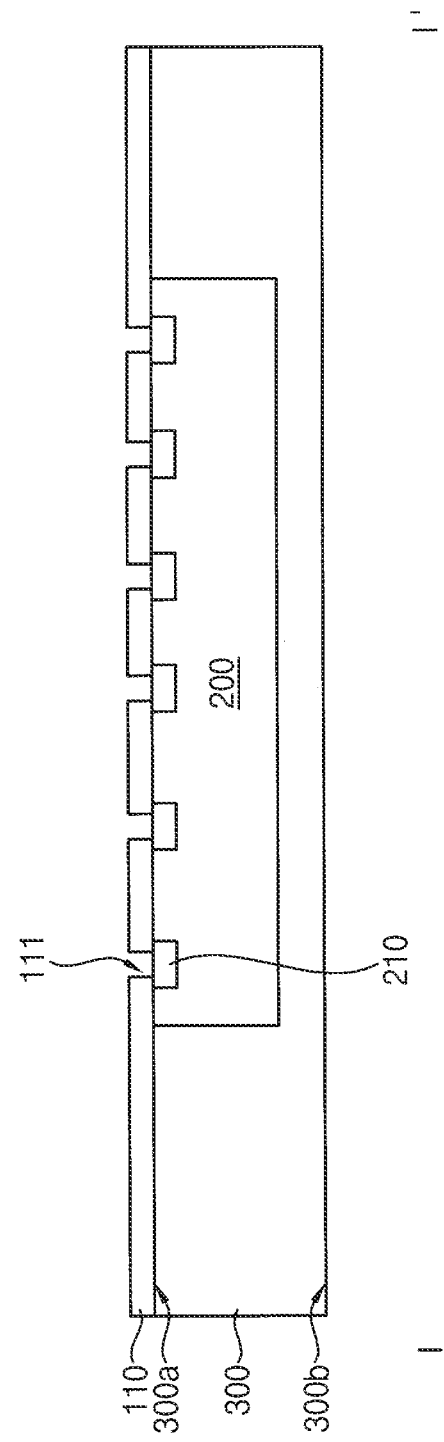

Referring to FIG. 10, a first insulation layer 110 may be formed to cover the first surface 300a of the mold substrate 300, and then, the first insulation layer 110 may be patterned to form first openings 111 exposing the chip pads 210 respectively.

For example, the first insulation layer 110 may include polymer, a dielectric material, etc. The first insulation layer 110 may be formed by a spin coating process, a vapor deposition process, etc.

Figure 11:
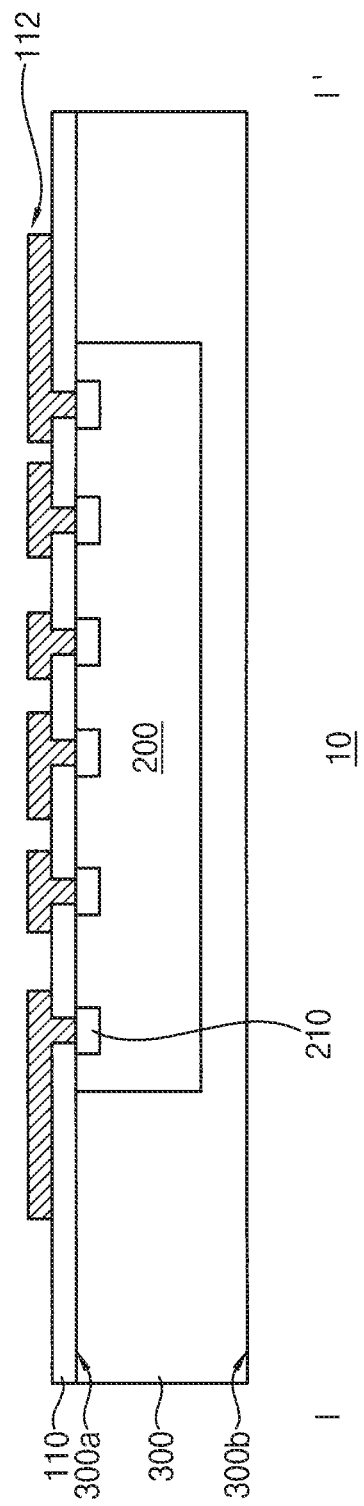
Figure 12:
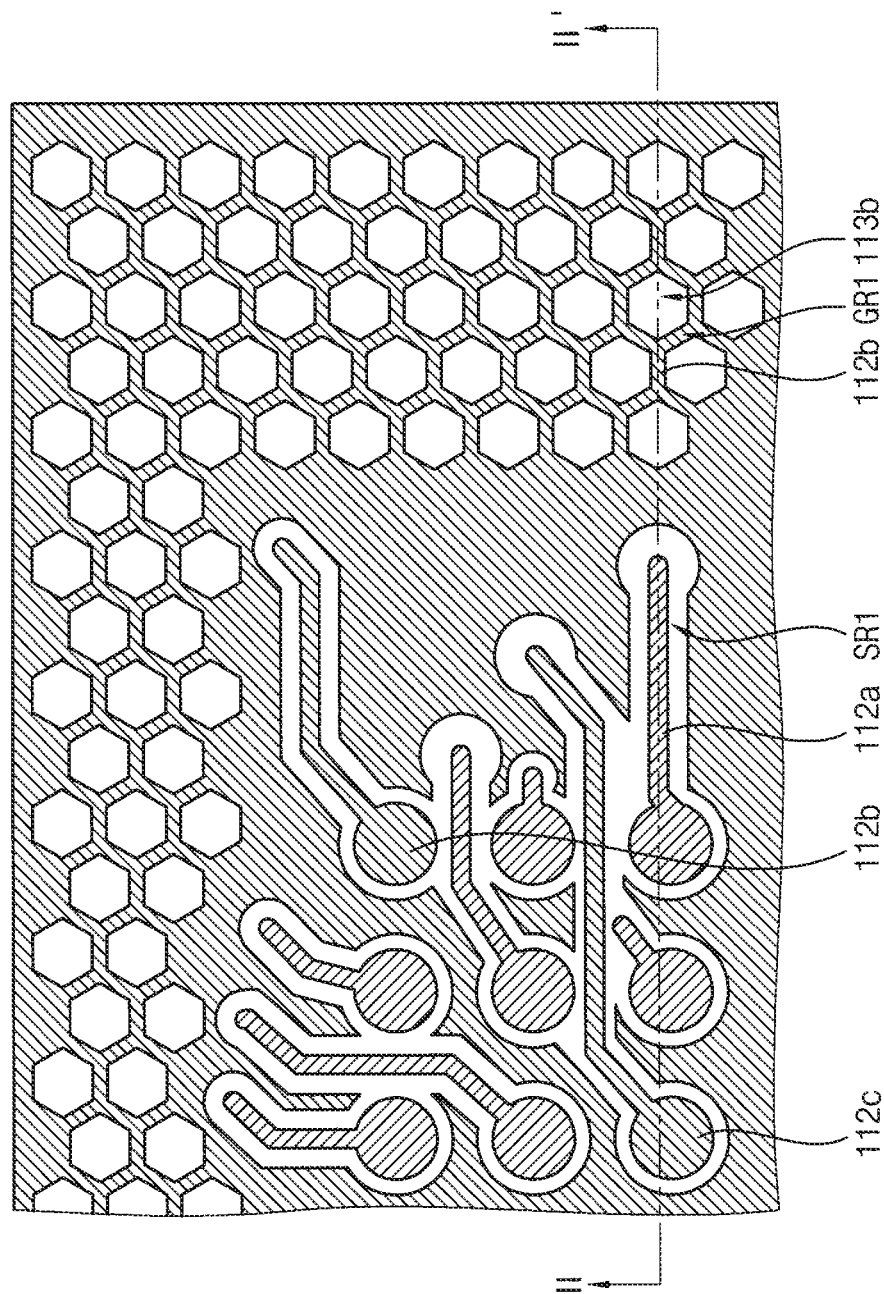
Figure 13:
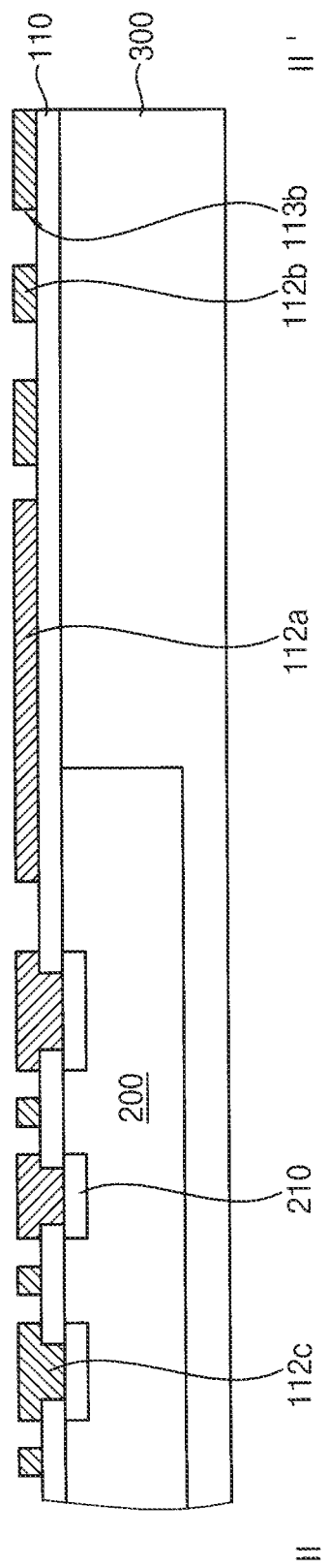

Referring to FIGS. 11 to 13, first redistribution wirings 112 may be formed on the first insulation layer 110 to make contact with the chip pads 210 through the first openings 111 respectively.

In example embodiments, the first redistribution wiring 112 may be formed on a portion of the first insulation layer 110 and the chip pads 210. The first redistribution wiring 112 may be formed by forming a seed layer on the portion of the first insulation layer 110 and in the first opening 111, patterning the seed layer and performing an electroplating process. Accordingly, at least a portion of the first redistribution wiring 112 may make contact with the chip pad 210 through the first openings 111.

For example, the first redistribution wiring may include aluminum (Al), copper (Cu), tin (Sn), nickel (Ni), gold (Au), platinum (Pt), or an alloy thereof.

As illustrated in FIGS. 12 and 13, the first redistribution wiring 112 may include the first signal line 112a and the first ground line 112b. Additionally, the first redistribution wiring 112 may further include the first power line 112c. At least a portion of the first signal line 112a may make contact with the signal chip pad through the first opening 111. The first ground line 112b may make contact with the ground chip pad through the first opening. The first power line 112c may make contact with the power chip pad through the first opening.

As viewed in plan view, the first signal line 112a may extend in a first signal region SR1. The first ground line 112b may extend in a first ground region GR1 which is positioned to be spaced apart from the first signal region SR1. The first ground line 112b may include a metal pattern having a plurality of through holes which have polygonal column shapes respectively. For example, the first ground line 112b may have the through holes 113b of hexagonal column shapes. The through holes 113b may be arranged in an array to have a honeycomb structure.

Figure 14:
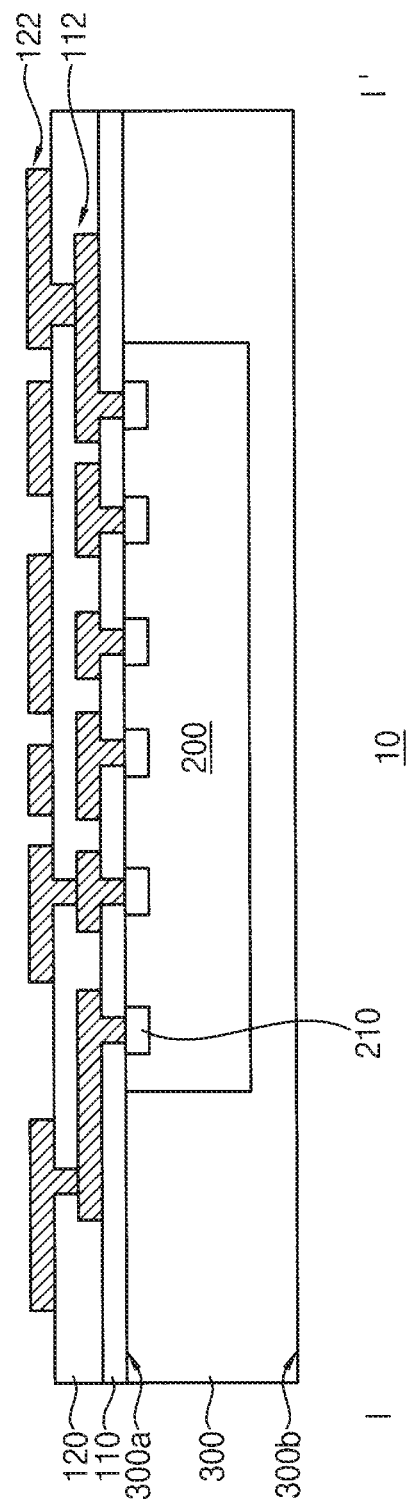
Figure 15:
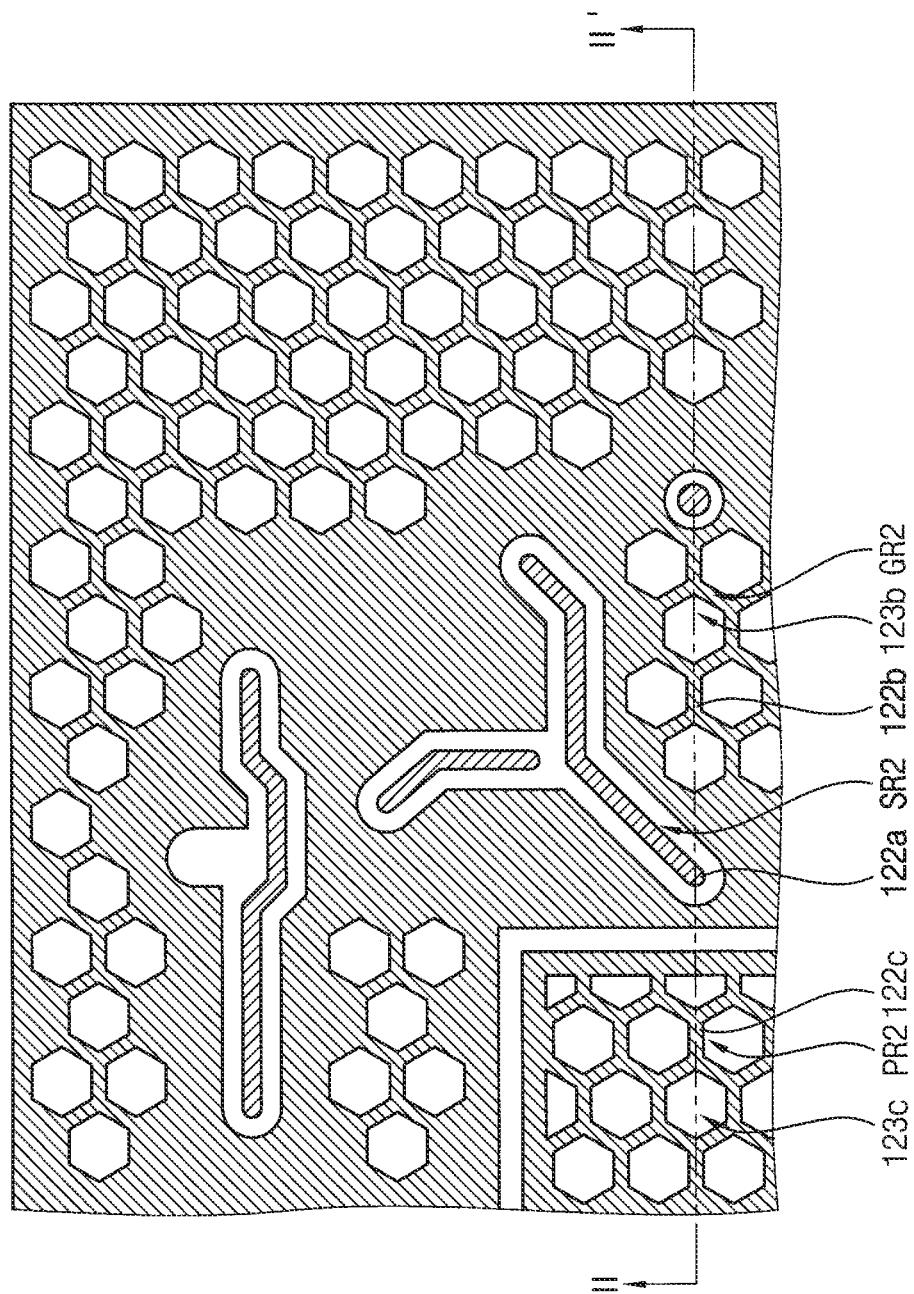
Figure 16:
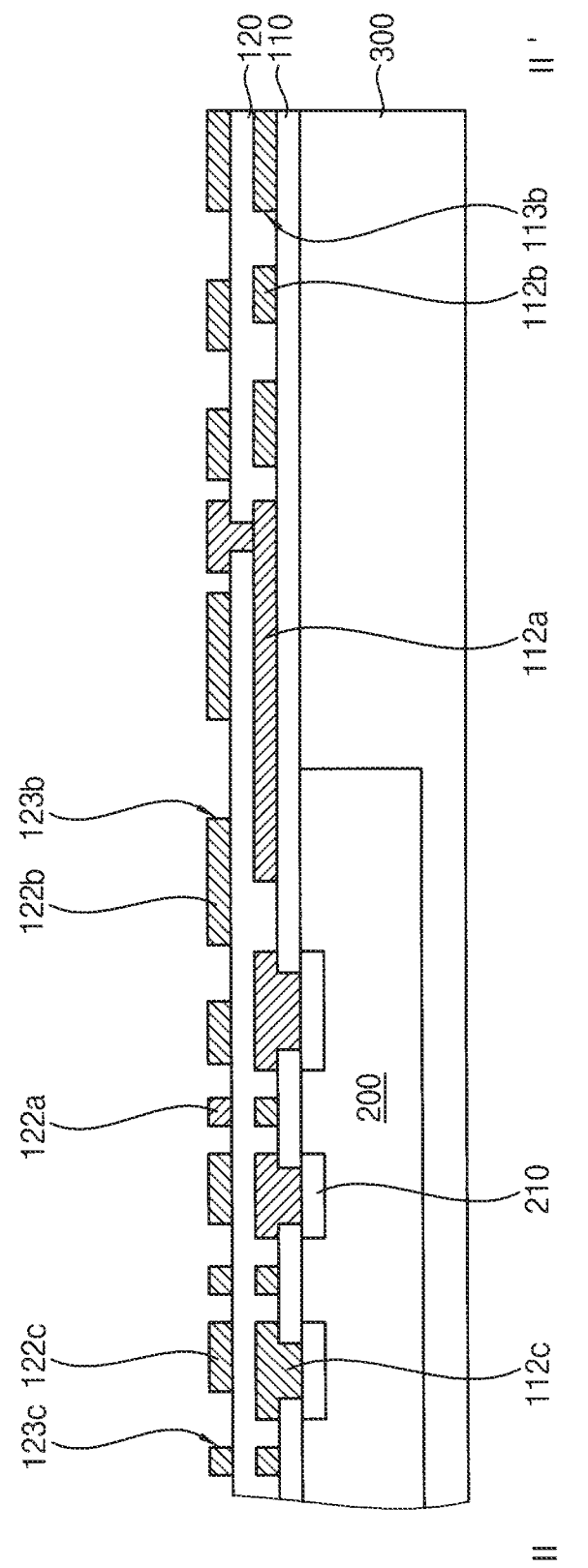

Referring to FIGS. 14 to 16, a second insulation layer 120 may be formed on the first surface 300a of the mold substrate 300 to cover the first redistribution wirings 122, and then, the second insulation layer 120 may be patterned to form second openings exposing portions of the first redistribution wirings 112 respectively. Then, second redistribution wirings 122 may be formed on the second insulation layer 120 to make contact with the first redistribution wirings 112 through the second openings respectively.

For example, the second insulation layer 120 may include polymer, a dielectric material, etc. The second insulation layer may be formed by a spin coating process, a vapor deposition process, etc.

The second redistribution wiring 122 may be formed by forming a seed layer on a portion of the second insulation layer 120 and in the second opening, patterning the seed layer and performing an electroplating process.

As illustrated in FIGS. 15 and 16, the second redistribution wiring 122 may include a second signal line 122a and a second ground line 122b. Additionally, the second redistribution wiring 122 may further include a second power line 122c. At least a portion of the second signal line 122a may make contact with the first signal line through the second opening. The second ground line 122b may make contact with the first ground line through the second opening. The second power line 122c may make contact with the first power line through the second opening.

As viewed in plan view, the second signal line 122a may extend in a second signal region SR2. The second ground line 122b may extend in a second ground region GR2 which is positioned to be spaced apart from the second signal region SR2. The second ground line 122b may include a metal pattern having a plurality of through holes which have polygonal column shapes. For example, the second ground line 122b may have the through holes 123b of hexagonal column shapes. The through holes 123b may be arranged in an array to have a honeycomb structure. Further, the second ground line 122c may have through holes 123c of hexagonal column shapes. The through holes 123c may be arranged in an array to have a honeycomb structure.

In example embodiments, the second ground region GR2 may be overlapped with the first signal region SR1. The second signal region SR2 may be overlapped with the first ground region GR1. Accordingly, the first redistribution wiring having the first signal line 112a may serve as a microstrip line where the ground line is arranged under the signal line, and the second redistribution wiring having the second signal line 122a may serve as a strip line where the signal line is interposed between two ground lines.

Figure 17:
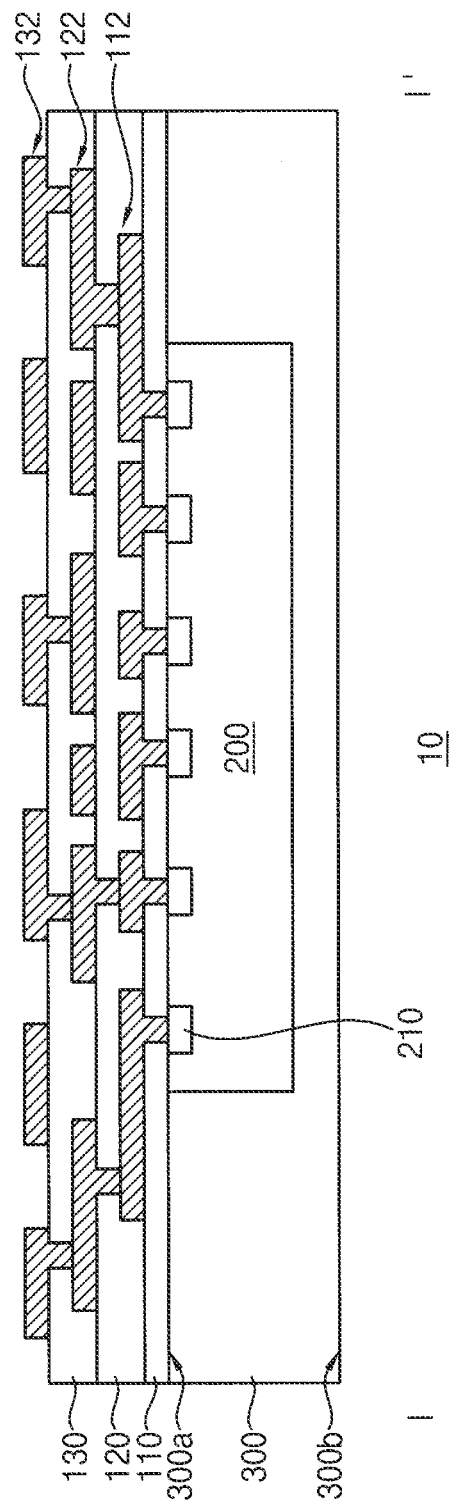
Figure 18:
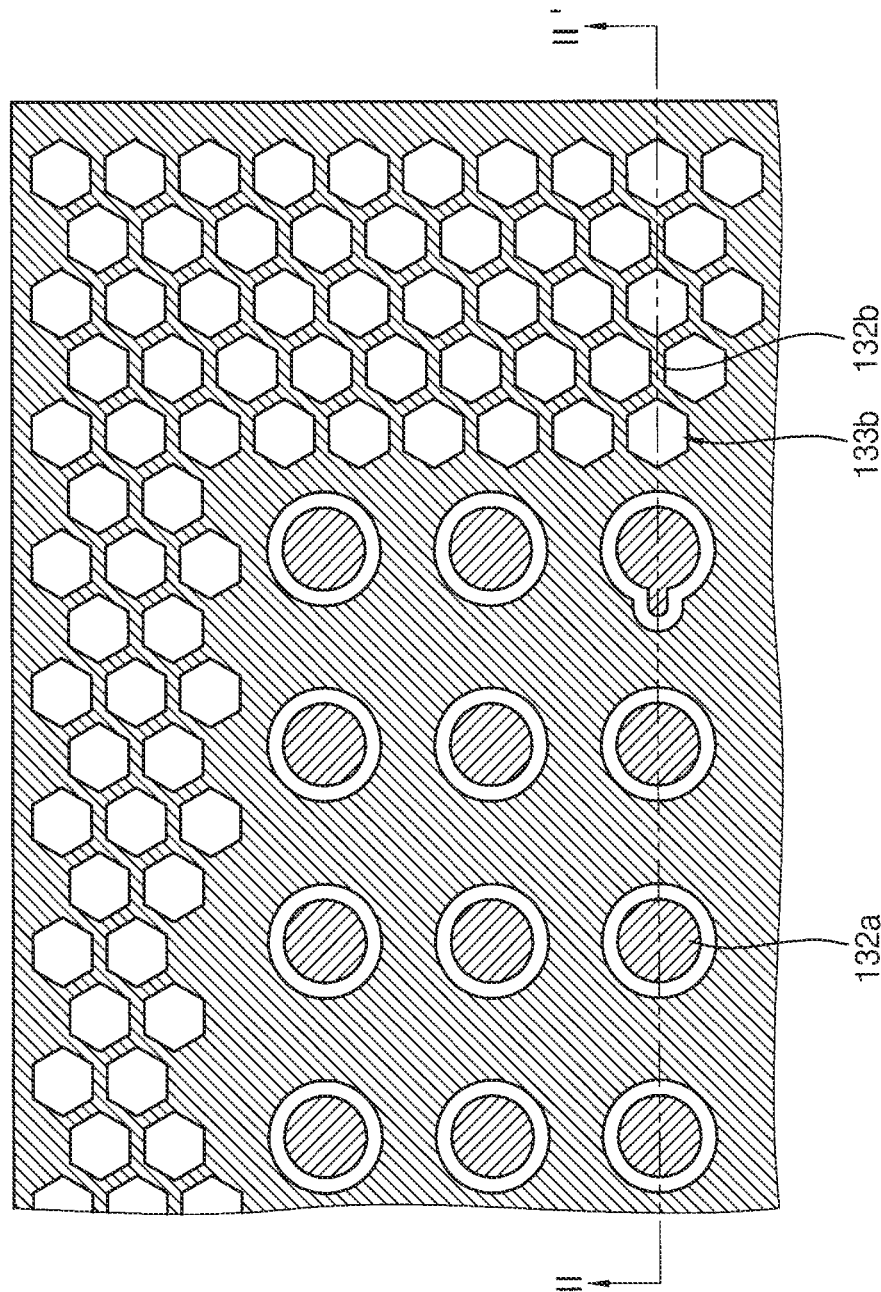
Figure 19:
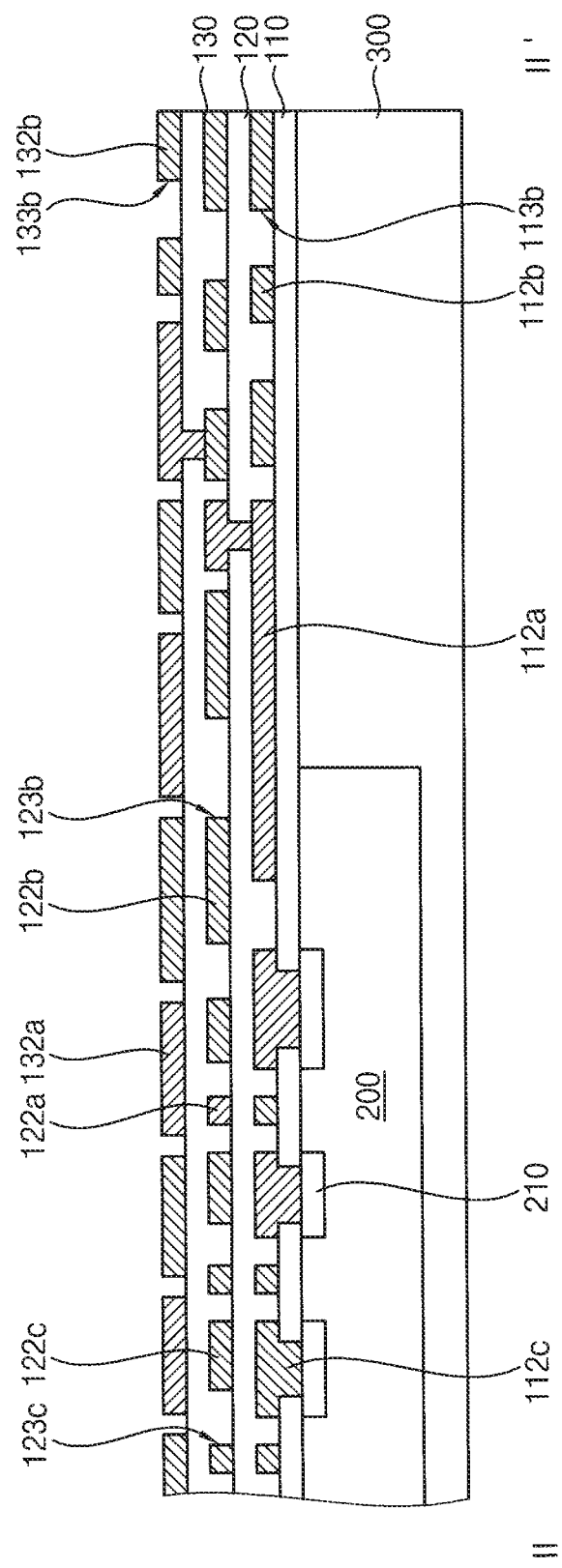

Referring to FIGS. 17 to 19, processes the same as or similar to the processes described with reference to FIG. 14 may be performed to form a third insulation layer 130 on the first surface 300a of the mold substrate 300 to cover the second redistribution wirings 122, and then, third redistribution wirings 132 may be formed on the third insulation layer 130 to make contact with the second redistribution wirings 122 through third openings respectively. The third redistribution wiring 132 may include a landing pad as described later.

As illustrated in FIGS. 18 and 19, the third redistribution wiring 132 may include a third signal line 132a and a third ground line 132b. Additionally, the third redistribution wiring 132 may further include a third power line. At least a portion of the third signal line 132a may make contact with the second signal line through the third opening. The third ground line 132b may make contact with the second ground line through the third opening.

As viewed in plan view, the third ground line 132b may extend in a third ground region. The third ground line 132b may include a metal pattern having a plurality of through holes which have polygonal column shapes respectively. For example, the third ground line 132b may have the through holes 133b of hexagonal column shapes. The through holes 133b may be arranged in an array to have a honeycomb structure.

Figure 20:
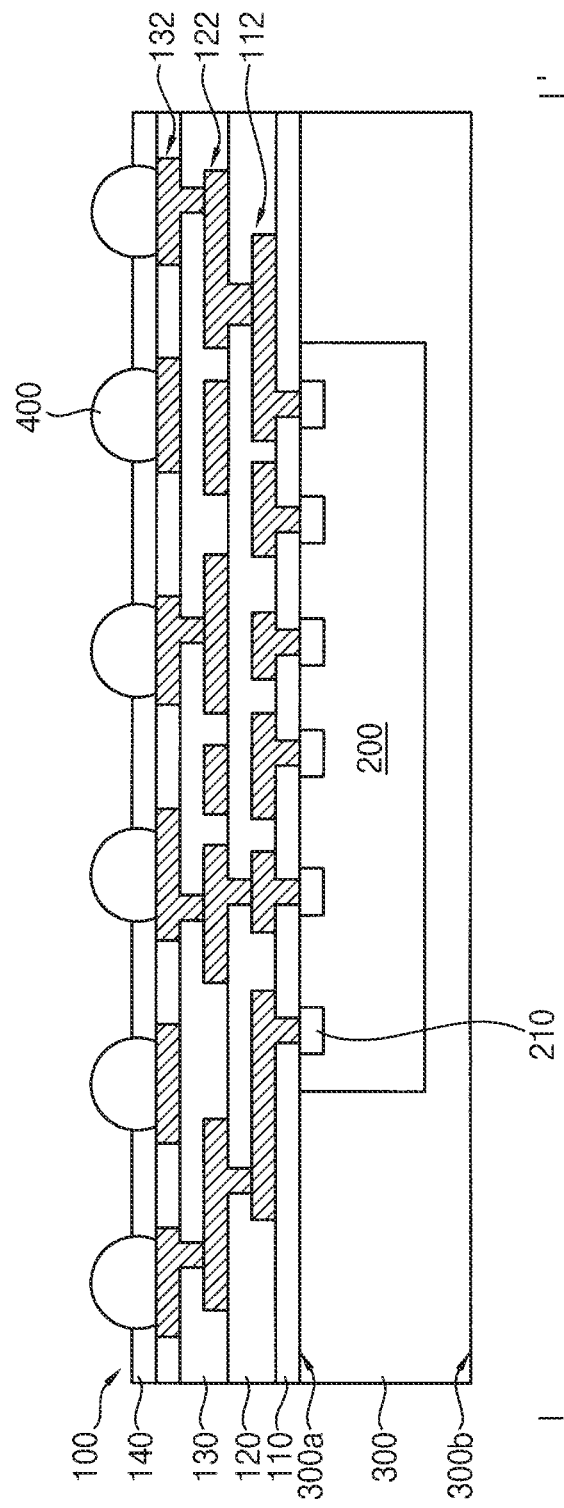
Figure 21:
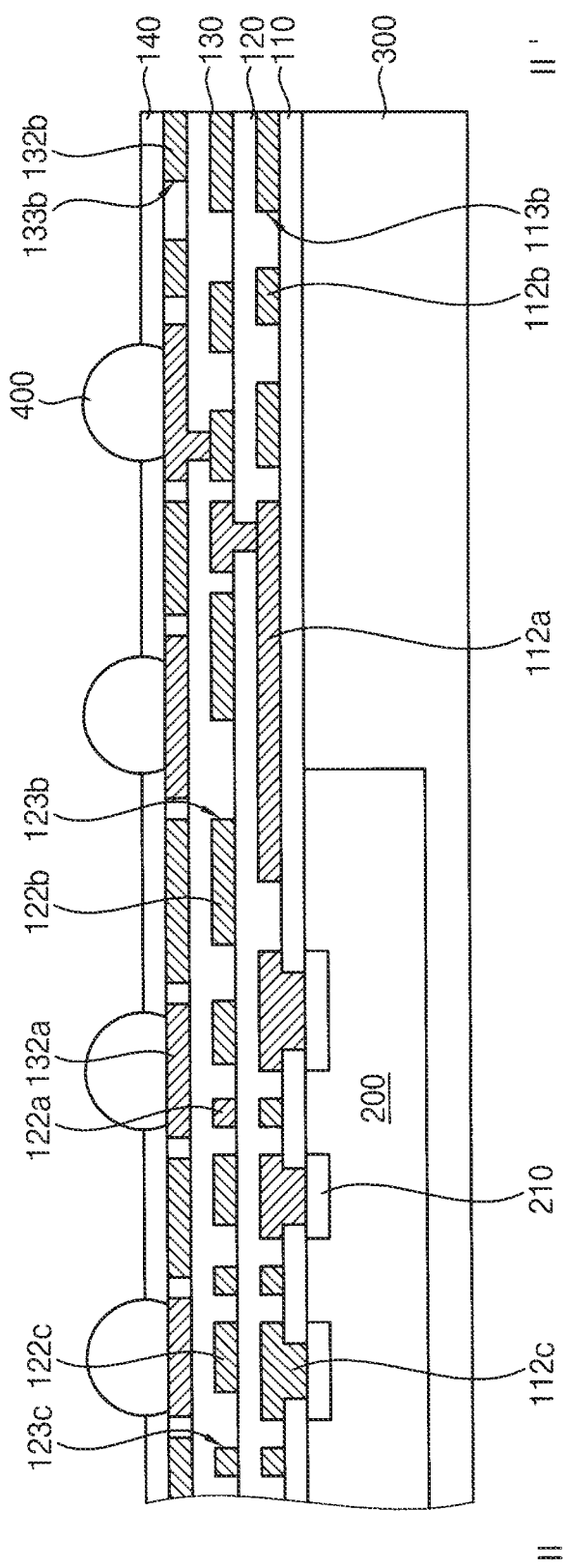

Referring to FIGS. 20 and 21, a fourth insulation layer 140 may be formed on the first surface 300a of the mold substrate 300 to expose only redistribution landing pads of the third redistribution wirings 132.

Thus, a redistribution wiring layer 100 including redistribution wirings electrically connected to the chip pads 210 may be formed on the first surface 300a of the mold substrate 300.

Then, outer connection members 400 electrically connected to the redistribution wirings may be formed on the redistribution wiring layer 100. For example, a solder ball as the outer connection member may be disposed on a portion of the third redistribution wiring 132. In this case, the portion of the third redistribution wiring 132 may serve as a landing pad, that is, a package pad. Thus, the redistribution wiring layer 100 may be formed to include fan out type solder ball landing pads which are formed on the mold substrate 300 corresponding to each die of a wafer by performing semiconductor manufacturing processes.

Then, a sawing process may be performed on the mold substrate 300 to form an individual fan out wafer level package including the mold substrate 300 and the redistribution wiring layer 100 on the mold substrate 300.

Figure 22:
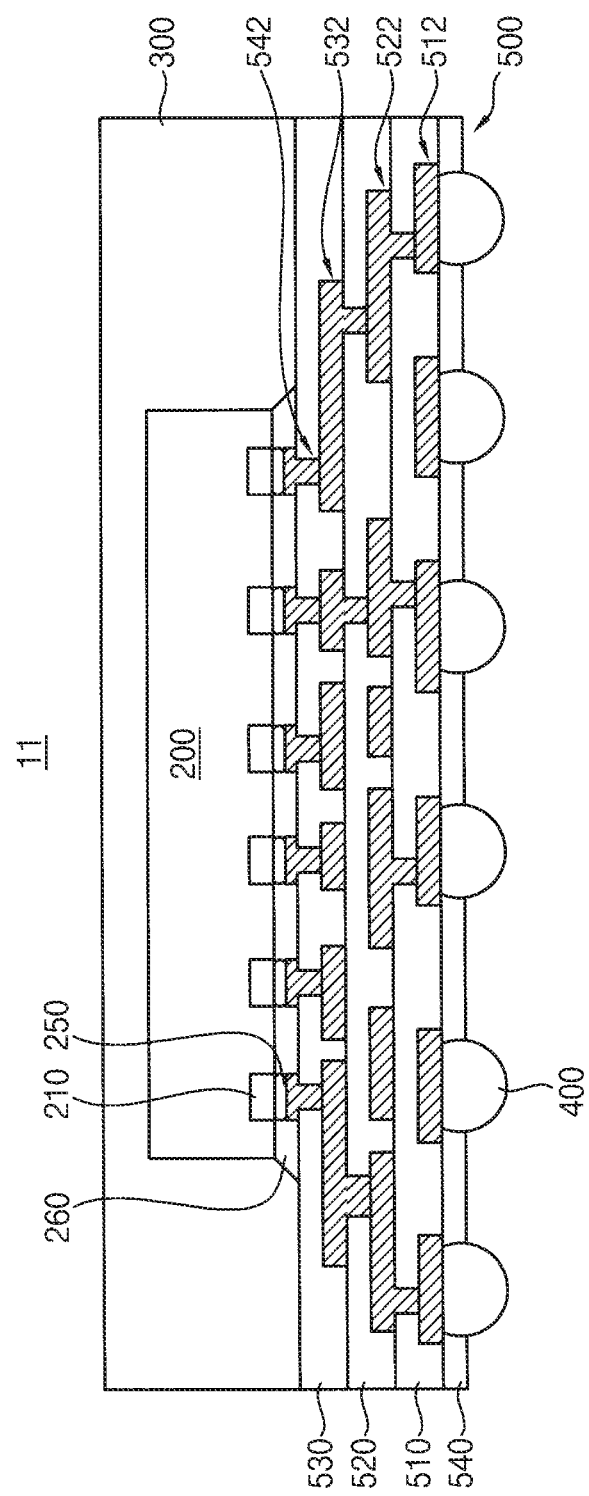
Figure 23:
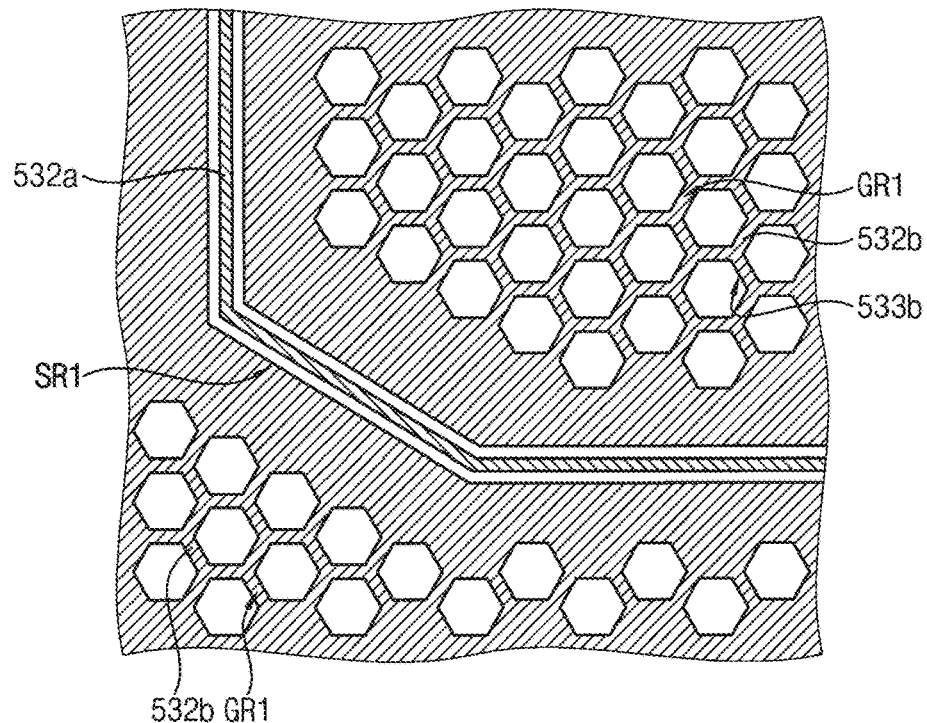
Figure 24:
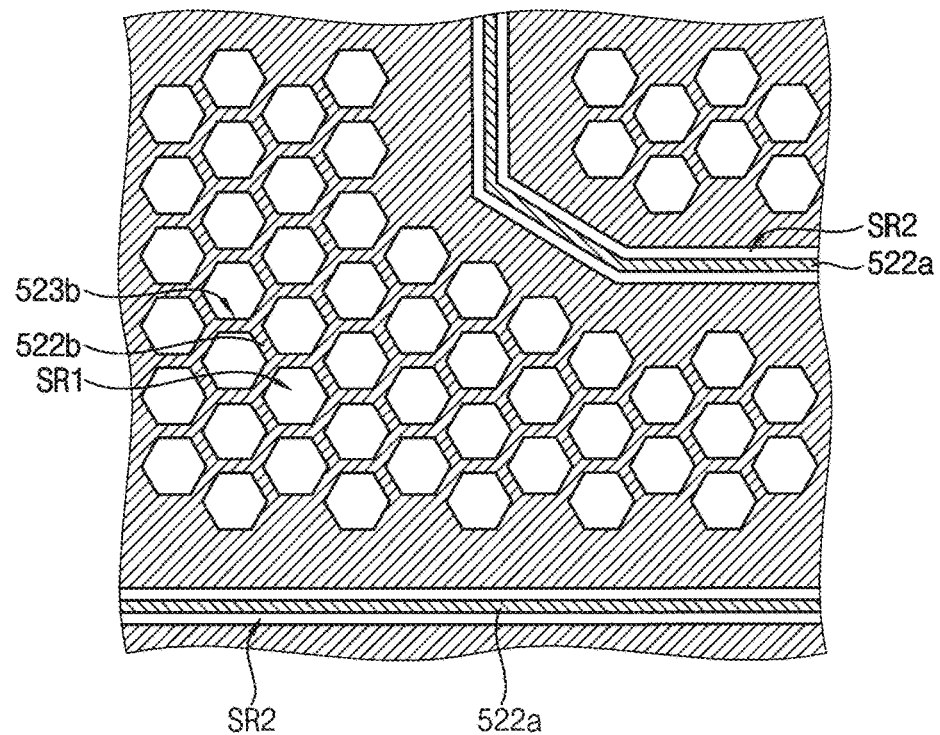

FIG. 22 is a cross-sectional view illustrating a semiconductor package in accordance with example embodiments. FIGS. 23 and 24 are plan views illustrating a second redistribution wiring layer and a third redistribution wiring layer in regions overlapping with each other. The semiconductor package may be substantially the same as or similar to the semiconductor package described with reference to FIG. 1 except for an interconnection between a semiconductor chip and a redistribution wiring layer. Thus, same reference numerals will be used to refer to the same or like elements and any further repetitive explanation concerning the above elements will be omitted.

Referring to FIGS. 22 to 24, a semiconductor package 11 may include a redistribution wiring layer 500, a semiconductor chip 200 stacked on the redistribution wiring layer 500 and a mold substrate 300 on the redistribution wiring layer 500 to cover the semiconductor chip 200.

In example embodiments, the redistribution wiring layer 500 may include first to third redistribution wiring layers.

As illustrated in FIG. 23, the third redistribution wiring layer of the redistribution wiring layer 500 may include third redistribution wirings 532. The third redistribution wiring 532 may include a third signal line 532a and a third ground line 532b. Further, the third redistribution wiring 532 may further include a third power line.

The third signal line 532a may extend in a first signal line SR1. The third ground line 532b may extend in a first ground region GR1 which is spaced apart from the first signal region SR1. The third ground line 532b may include a metal pattern having a plurality of through holes which have polygonal column shapes respectively. For example, the third ground line 532b may have through holes 533b of hexagonal column shapes. The through holes 533b may be arranged in an array to have a honeycomb structure.

As illustrated in FIG. 24, the second redistribution wiring layer of the redistribution wiring layer 500 may include second redistribution wirings 522. The second redistribution wiring 522 may include a second signal line 522a and a second ground line 522b. Further, the second redistribution wiring 522 may further include a second power line.

The second signal line 522a may extend in a second signal line SR2. The second ground line 522b may extend in a second ground region GR2 which is spaced apart from the second signal region SR2. The second ground line 522b may include a metal pattern having a plurality of through holes which have polygonal column shapes respectively. For example, the second ground line 522b may have through holes 523b of hexagonal column shapes. The through holes 523b may be arranged in an array to have a honeycomb structure.

The first redistribution wiring layer of the redistribution wiring layer 500 may include first redistribution wirings. The first redistribution wiring 512 may include a first signal line and a first ground line. Further, the first redistribution wiring 512 may further include a first power line. The first redistribution wiring 512 may include a landing pad.

Although it is not illustrated in the figures, as viewed in plan view, the first ground line may extend in a third ground region. The first ground line may include a metal pattern having a plurality of through holes which have polygonal column shapes respectively. For example, the first ground line may have through holes of hexagonal column shapes. The through holes may be arranged in an array to have a honeycomb structure.

In example embodiments, the second ground region GR2 may be overlapped with the first signal region SR1. The second signal region SR2 may be overlapped with the first ground region GR1. Accordingly, the third redistribution wiring layer having the third signal line 532a may serve as a microstrip line where a signal line is over a ground plane, and the second redistribution wiring layer having the second signal line 522a may serve as a strip line where a signal line is interposed between two ground planes.

In example embodiments, the semiconductor chip 200 may be mounted on the redistribution wiring layer 500 in a flip chip bonding manner. In this case, the semiconductor chip 200 may be mounted on the redistribution wiring layer 500 such that an active surface of the semiconductor chip 200 on which chip pads 210 formed faces the redistribution wiring layer 500. The chip pads 210 of the semiconductor chip 200 may be electrically connected to landing pads of the fourth redistribution wirings 542 of the redistribution wiring layer 500 by conductive bumps, for example, solder bumps 250.

Hereinafter, a method of manufacturing the semiconductor package in FIG. 22 will be explained.

FIGS. 25 to 29 are views illustrating a method of manufacturing a semiconductor package in accordance with example embodiments.

Figure 25:
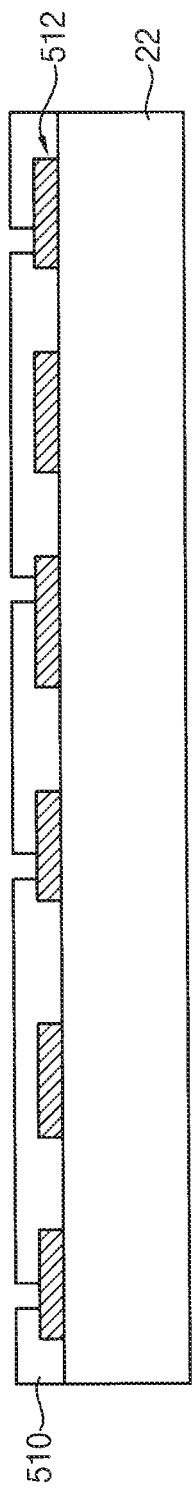
Figure 26:
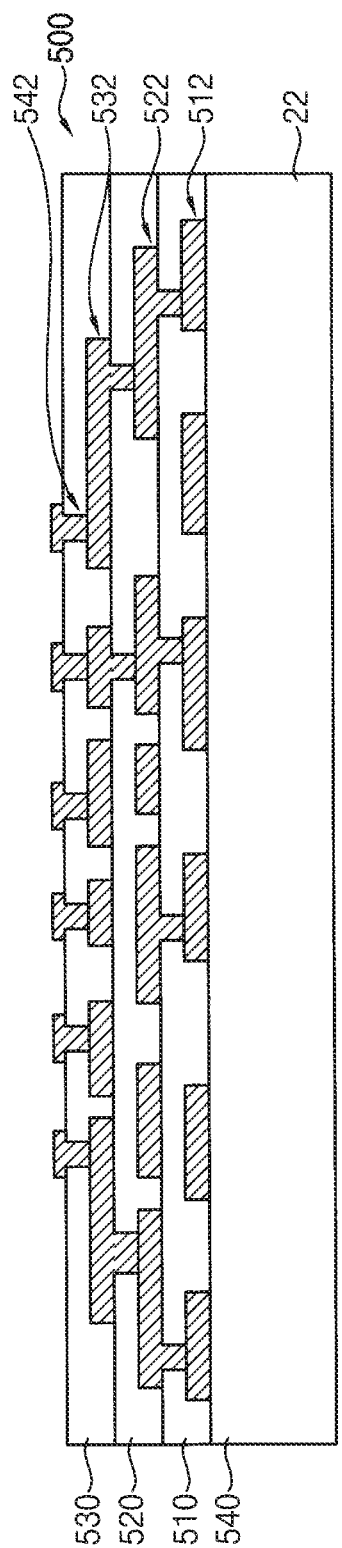

Referring to FIGS. 25 and 26, a redistribution wiring layer 500 may be formed on a dummy substrate 22.

In example embodiments, first, first redistribution wirings 512 may be formed on the dummy substrate 22, and then, a first insulation layer 510 may be formed on the dummy substrate 22 to have first openings exposing portions of the first redistribution wirings 512.

The dummy substrate 20 may be used as a base substrate on which the redistribution wiring layer is formed, at least one semiconductor chip is to be stacked on the redistribution wiring and then molded. The dummy substrate 20 may have a size corresponding to a wafer on which a semiconductor fabrication process is performed. For example, the dummy substrate 22 may include a silicon substrate, a glass substrate, a metal or non-metal plate, etc.

The first redistribution wiring 512 may include a first signal line and a first ground line. Further, the first redistribution wiring 512 may further include a first power line. The first redistribution wiring 512 may include a landing pad as described later.

Although it is not illustrated in the figures, as viewed in plan view, the first ground line may extend in a third ground region. The first ground line may include a metal pattern having a plurality of through holes which have polygonal column shapes respectively. For example, the first ground line may have through holes of hexagonal column shapes. The through holes may be arranged in an array to have a honeycomb structure.

Then, second redistribution wirings 522 may be formed on the first insulation layer 510 on the dummy substrate 22 to directly contact the portions of the first redistribution wirings 512 through the first openings, and then, a second insulation layer 520 may be formed on the first insulation layer 510 to have second openings exposing portions of the second redistribution wirings 522.

As illustrated in FIG. 24, the second redistribution wiring 522 may include a second signal line 522a and a second ground line 522b. Further, the second redistribution wiring 522 may further include a second power line. At least a portion of the second signal line 522a may directly contact the first signal line through the second opening. The second ground line 522b may directly contact the first ground line through the second opening.

The second signal line 522a may extend in a second signal line SR2. The second ground line 522b may extend in a second ground region GR2 which is spaced apart from the second signal region SR2. The second ground line 522b may include a metal pattern having a plurality of through holes which have polygonal column shapes respectively. For example, the second ground line 522b may have through holes 523b of hexagonal column shapes. The through holes 523b may be arranged in an array to have a honeycomb structure.

Then, third redistribution wirings 532 may be formed on the second insulation layer 520 to directly contact the portions of the second redistribution wirings 522 through the second openings, and then, a third insulation layer 530 may be formed on the second insulation layer 520 to have third openings exposing portions of the third redistribution wirings 532.

As illustrated in FIG. 23, the third redistribution wiring 532 may include a third signal line 532a and a third ground line 532b. Further, the third redistribution wiring 532 may further include a third power line. At least a portion of the third signal line 532a may directly contact the second signal line through the third opening. The third ground line 532b may directly contact the second ground line through the third opening.

The third signal line 532a may extend in a first signal line SR1. The third ground line 532b may extend in a first ground region GR1 which is spaced apart from the first signal region SR1. The third ground line 532b may include a metal pattern having a plurality of through holes which have polygonal column shapes respectively. For example, the third ground line 532b may have through holes 533b of hexagonal column shapes. The through holes 533b may be arranged in an array to have a honeycomb structure.

In example embodiments, the second ground region GR2 may be overlapped with the first signal region SR1. The second signal region SR2 may be overlapped with the first ground region GR1.

Then, fourth redistribution wirings 542 may be formed on the third insulation layer 530 on the dummy substrate 22 to directly contact the third redistribution wirings 532 through the third openings. The fourth redistribution wiring 542 may include a landing pad as described later.

Thus, the redistribution wiring layer 500 may be formed on the dummy substrate 22.

Figure 27:
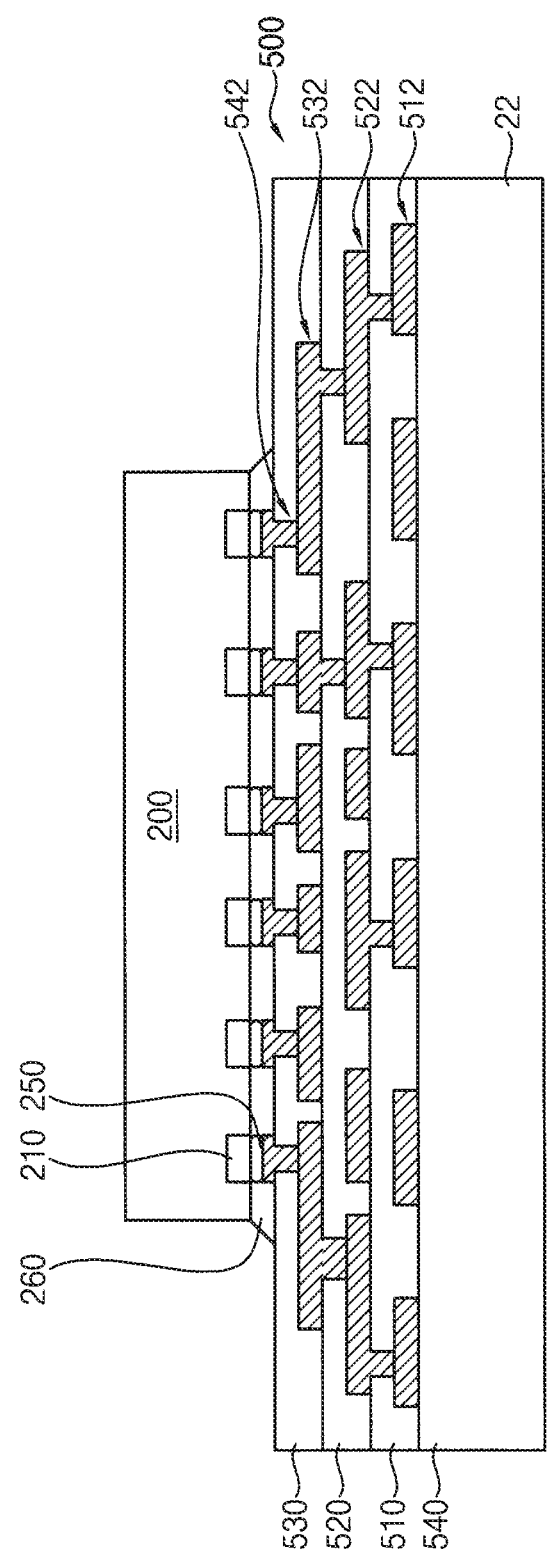

Referring to FIG. 27, a semiconductor chip 200 may be stacked on the redistribution wiring layer 500.

In example embodiments, the semiconductor chip 200 may be mounted on the redistribution wiring layer 500 in a flip chip bonding manner. In this case, the semiconductor chip 200 may be mounted on the redistribution wiring layer 500 such that an active surface of the semiconductor chip 200 on which chip pads 210 formed faces the redistribution wiring layer 500. The chip pads 210 of the semiconductor chip 200 may be electrically connected to landing pads of the fourth redistribution wirings 542 of the redistribution wiring layer 500 by conductive bumps, for example, solder bumps 250.

An underfill member 260 may be filled between a lower surface of the semiconductor chip 200 and an upper surface of the redistribution wiring layer 500.

Figure 28:
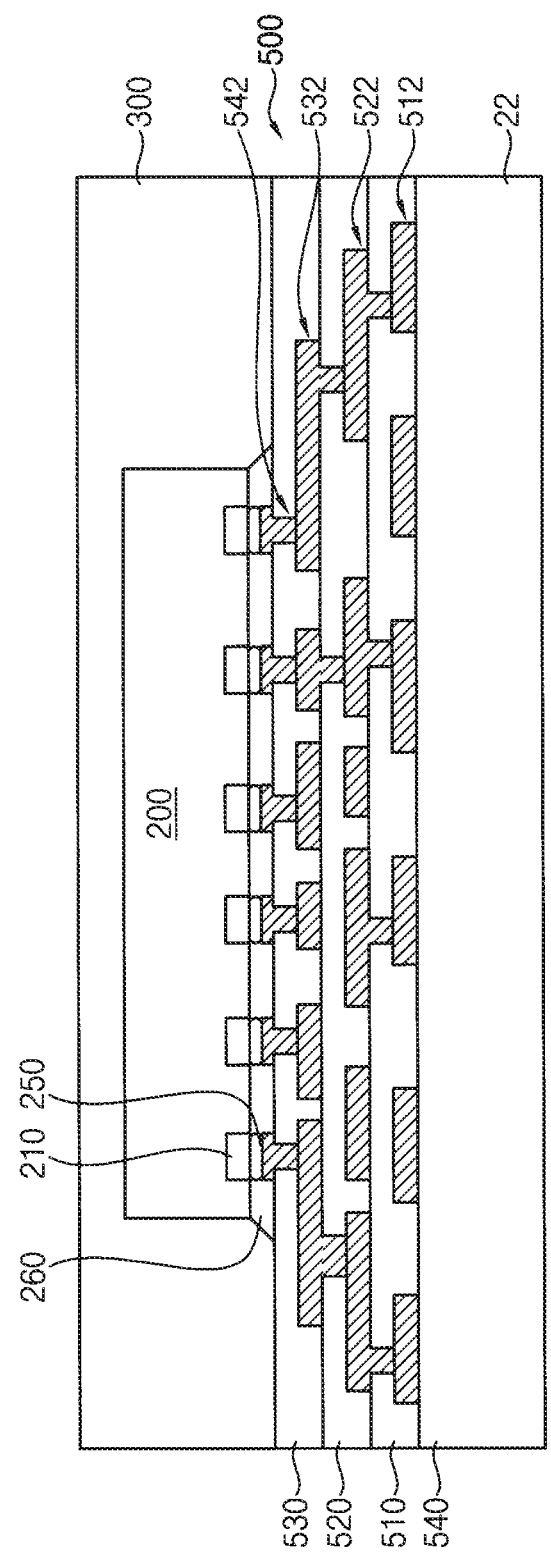

Referring to FIG. 28, a mold substrate 300 may be formed on the redistribution wiring layer 500 to cover the semiconductor chip 200.

In example embodiments, a molding process may be performed on the redistribution wiring layer 500 to form the mold substrate 300 covering the semiconductor chip 200. For example, the mold substrate 300 may include an epoxy molding compound.

Figure 29:
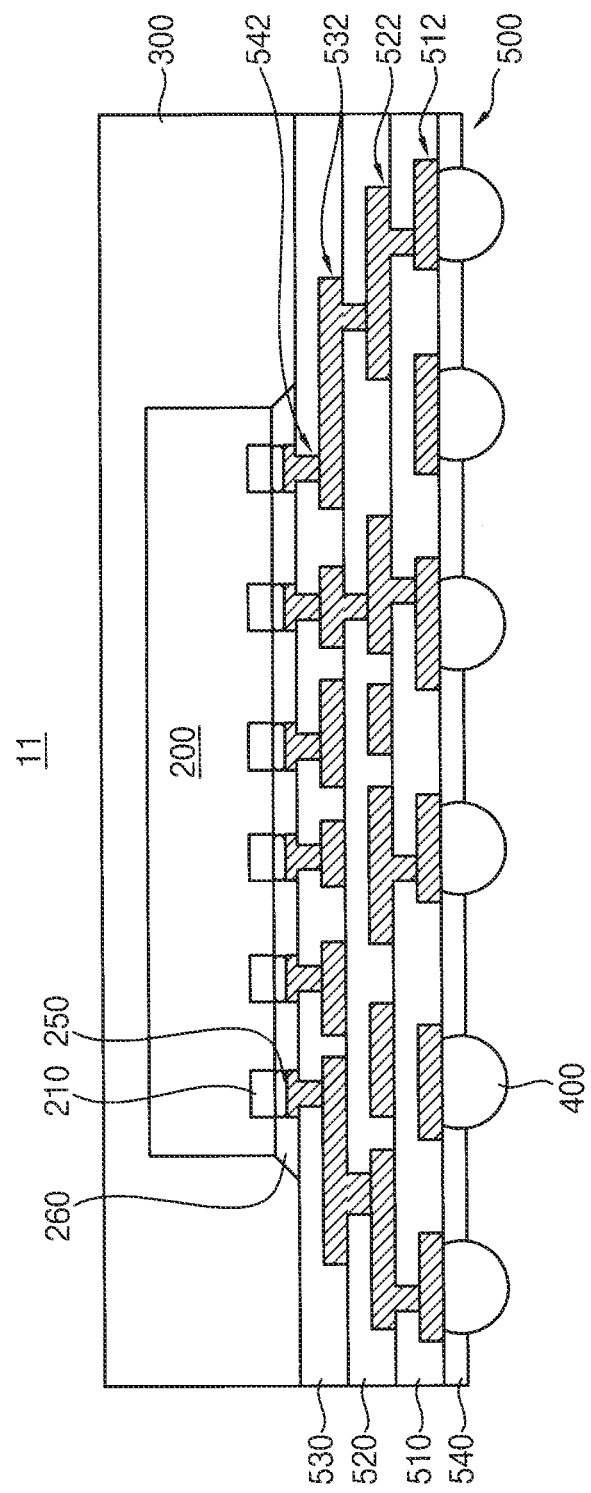

Referring to FIG. 29, the dummy substrate 22 may be removed from the redistribution wiring layer 500, and then, outer connection members 400 may be formed on the redistribution wiring layer 100 to be electrically connected to the redistribution wirings. For example, a solder ball as the outer connection member may be disposed on a portion of the first redistribution wiring 512. In this case, the portion of the first redistribution wiring 512 may serve as a landing pad, that is, a package pad.

Then, a sawing process may be performed on the mold substrate 300 to form an individual fan out wafer level package including the mold substrate 300 and the redistribution wiring layer 500 on the mold substrate 300.

Figure 30A:
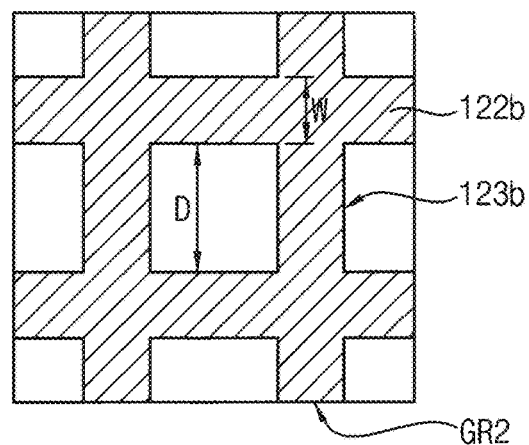
Figure 30B:
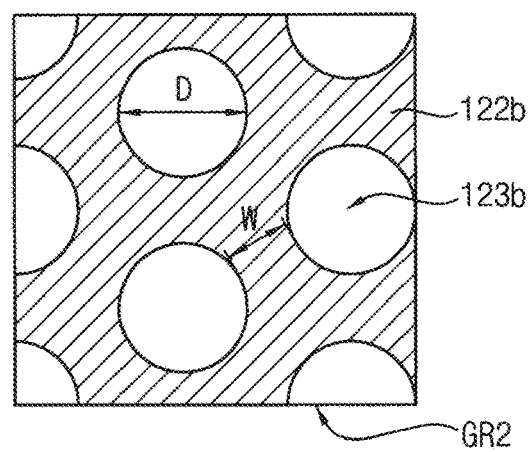
Figure 30C:
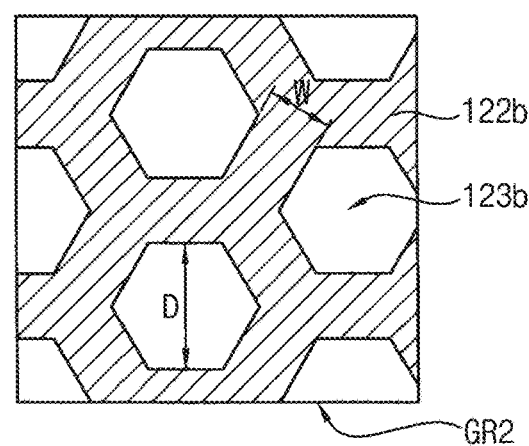

FIGS. 30A to 30C are plan views illustrating portions of a ground (or, alternatively, a power) line of a redistribution wiring layer in accordance with example embodiments.

Referring to FIGS. 30A to 30C, a ground line of a redistribution wiring layer may include through holes of square, circular or hexagonal column shapes. The pattern structure having the through holes of the square column shapes may have a metal ratio of about 55.56%, the pattern structure having the through holes of the circular column shapes may have a metal ratio of about 57.25%, and the pattern structure having the through holes of the hexagonal column shapes may have a metal ratio of about 53.05%.

A warpage of the redistribution wiring layer may be adjusted by a metal ratio in each level of the redistribution wiring layer. As the metal ratio is decreased, peeling off of the layers due to thermal coefficient difference may be inhibited (or, alternatively, prevented).

The method of manufacturing the semiconductor package may be iterated to manufacture semiconductor packages including logic devices and memory devices. For example, the semiconductor package may include logic devices such as central processing units (CPUs), main processing units (MPUs), or application processors (APs), or the like, and volatile memory devices such as DRAM devices, SRAM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A semiconductor package, comprising:
a mold substrate;
at least one semiconductor chip in the mold substrate, the at least one semiconductor chip including chip pads; and
a redistribution wiring layer covering a first surface of the mold substrate, the redistribution wiring layer including a first redistribution wiring and a second redistribution wiring stacked in at least two levels, the first redistribution wiring and the second redistribution wiring configured to electrically connect to the chip pads, the first redistribution wiring including a signal line extending in a first region, and the second redistribution wiring including a ground line in a second region overlapping with the first region, the ground line having a plurality of through holes therein of each having a polygonal column shape and arranged in an array within the ground line to form a first honeycomb structure in the second region of the second redistribution wiring,
wherein the plurality of through holes in the ground line have a hexagonal column shape.

2. The semiconductor package of claim 1, wherein the second redistribution wiring includes a power line in a region spaced apart from the second region, the power line having a plurality of through holes therein of the polygonal column shape.

3. The semiconductor package of claim 1, wherein the second redistribution wiring further include a second signal line in a region spaced apart from the second region.

4. The semiconductor package of claim 3, wherein the first redistribution wiring further includes another ground line in a region spaced apart from the first region, the another ground line having a plurality of through holes therein each having the polygonal column shape and arranged in a array within the another ground line to form a second honeycomb structure in the region spaced apart from the first region of the first redistribution wiring such that the first honeycomb structure and the second honeycomb structure are at different layers within the redistribution wiring layer and spaced apart from each other in a length direction of the redistribution wiring layer.

5. The semiconductor package of claim 4, wherein the region spaced apart from the second region of the second redistributing wiring overlaps with the region spaced apart from the first region of the first redistribution wiring such that the second redistribution wiring is a strip line where the second signal line is interposed between two ground planes.

6. The semiconductor package of claim 1, wherein at least a portion of the first redistribution wiring directly contacts at least one of the chip pads.

7. The semiconductor package of claim 1, wherein the semiconductor chip is mounted on the redistribution wiring layer in a flip chip bonding manner.

8. The semiconductor package of claim 7, wherein the first redistribution wiring is electrically connected to at least one of the chip pads via a solder bump therebetween.

9. The semiconductor package of claim 1, wherein the redistribution wiring layer further includes a third redistribution wiring under the first redistribution wiring, the third redistribution wiring including another ground line extending in a third region, the third region overlapping the first region.

10. The semiconductor package of claim 1, wherein the second region of the second redistribution wiring overlaps with the first region of the first redistribution wiring such that the first redistribution wiring is a microstrip line with the signal line being over a ground plane.

11. A semiconductor package, comprising:
a redistribution wiring layer including a first redistribution wiring and a second redistribution wiring stacked in at least two levels, the first redistribution wiring including a signal line extending in a first region, and the second redistribution wiring including a ground line in a second region overlapping with the first region, the ground line having a plurality of through holes therein each having a polygonal column shape and arranged in an array within the ground line to form a first honeycomb structure in the second region of the second redistribution wiring;
at least one semiconductor chip on the redistribution wiring layer, the at least one semiconductor chip including chip pads electrically connected to the first redistribution wiring and the second redistribution wiring; and
a mold substrate on the redistribution wiring layer such that the mold substrate covers the semiconductor chip, wherein the plurality of through holes of the ground line have a hexagonal column shape.

12. The semiconductor package of claim 11, wherein the second redistribution wiring includes a power line in a region spaced apart from the second region, the power line having a plurality of through holes therein of the polygonal column shape.

13. The semiconductor package of claim 11, wherein the second redistribution wiring further includes a second signal line in a region spaced apart from the second region.

14. The semiconductor package of claim 13, wherein the first redistribution wiring further includes another ground line in a region spaced apart from the first region, the another ground line having a plurality of through holes therein each having the polygonal column shape and arranged in a array within the another ground line to form a second honeycomb structure in the region spaced apart from the first region of the first redistribution wiring such that the first honeycomb structure and the second honeycomb structure are at different layers within the redistribution wiring layer and spaced apart from each other in a length direction of the redistribution wiring layer.

15. The semiconductor package of claim 14, wherein the region spaced apart from the second region of the second redistributing wiring overlaps with the region spaced apart from the first region of the first redistribution wiring such that the second redistribution wiring is a strip line where the second signal line is interposed between two ground planes.

16. The semiconductor package of claim 11, wherein the second region of the second redistribution wiring overlaps with the first region of the first redistribution wiring such that the first redistribution wiring is a microstrip line with the signal line being over a ground plane.

\* \* \* \* \*